(12) United States Patent  
Kawamura et al.

(10) Patent No.: US 7,714,383 B2
(45) Date of Patent: May 11, 2010

(54) SEMICONDUCTOR DEVICE

(75) Inventors: Keiko Kawamura, Kanagawa-ken (JP);
Kenji Maeyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/258,135

(22) Filed: Oct. 24, 2008

(65) Prior Publication Data

US 2009/0121285 A1  May 14, 2009

Related U.S. Application Data

(62) Division of application No. 11/608,003, filed on Dec. 7, 2006, now abandoned.

(30) Foreign Application Priority Data

Dec. 15, 2005 (JP) ............................. 2005-361962
Oct. 16, 2006 (JP) ............................. 2006-281316

(51) Int. Cl.
*H01L 29/94* (2006.01)
(52) U.S. Cl. .................. 257/330; 257/331; 257/332; 257/333; 257/334; 257/E29.201; 257/E29.26
(58) Field of Classification Search ................ 257/330, 257/331, 332, 333, 334, E29.201, E29.26
See application file for complete search history.

(56) References Cited

U.S. PATENT DOCUMENTS

2005/0167744 A1   8/2005   Yilmaz

FOREIGN PATENT DOCUMENTS

| JP | 2002-83963 | 3/2002 |
| JP | 2003-69017 | 3/2003 |

*Primary Examiner*—Tan N Tran
(74) *Attorney, Agent, or Firm*—Oblon, Spivak, McClelland, Maier & Neustadt, L.L.P.

(57) ABSTRACT

A semiconductor device includes: a semiconductor layer, a first semiconductor region provided on a major surface of the semiconductor layer, a second semiconductor region provided in a surface portion of the first semiconductor region, a trench extending through the second semiconductor region and the first semiconductor region to the semiconductor layer, a first insulating film provided on an inner wall of the trench, a third semiconductor region filling the trench below an interface between the semiconductor layer and the first semiconductor region, a second insulating film provided on the third semiconductor region, a gate electrode filling the trench above the second insulating film. A portion of the first insulating film in contact with the semiconductor layer is opened. The semiconductor layer is in contact with the third semiconductor region through the opened portion.

2 Claims, 29 Drawing Sheets

SEMICONDUCTOR DEVICE

CROSS-REFERENCE TO RELATED APPLICATION

This application is a division of and claims the benefit of priority under 35 U.S.C. §120 from U.S. Ser. No. 11/608,003 filed Dec. 7, 2006, and claims the benefit of priority under U.S.C. §119 from Japanese Patent Application No. 2005-361962 filed Dec. 15, 2005, and Japanese Patent Application No. 2006-281316 filed on Oct. 16, 2006, the entire contents of each of which are incorporated herein by reference.

BACKGROUND OF THE INVENTION

1. Field of the Invention

This invention relates to a semiconductor device, and more particularly to a semiconductor device having a trench gate structure.

2. Background Art

Trench gate type MOSFETs (Metal Oxide Semiconductor Field Effect Transistors) are known as semiconductor devices suitable to power electronics and other applications requiring high withstand voltage and low ON resistance (see, e.g., JP 2002-083963A).

JP 2002-083963A discloses a MOSFET having a trench that is formed to reach an N-type substrate through a P-type well layer and an N-type drift layer. An N-type source layer is formed in the surface of the well layer. A buried electrode of polysilicon is formed via an insulating film in a region extending from the drift layer to the substrate in the trench. A gate electrode of polysilicon is formed via an insulating film in a region extending from the source layer through the well layer to the drift layer in the trench. The buried electrode is electrically insulated from the gate electrode.

In the configuration disclosed in JP 2002-083963A, the buried electrode is completely covered with the insulating film and does not form a p-n junction with the drift layer. Therefore, when the dopant concentration in the drift layer is increased for reducing ON resistance, it is difficult to completely deplete the drift layer and to obtain high withstand voltage.

SUMMARY OF THE INVENTION

According to an aspect of the invention, there is provided a semiconductor device including: a semiconductor layer of a first conductivity type; a first semiconductor region of a second conductivity type provided on a major surface of the semiconductor layer; a second semiconductor region of the first conductivity type provided in a surface portion of the first semiconductor region; a trench extending through the second semiconductor region and the first semiconductor region to the semiconductor layer; a first insulating film provided on an inner wall of the trench; a third semiconductor region of the second conductivity type filling the trench below an interface between the semiconductor layer and the first semiconductor region; a second insulating film provided on the third semiconductor region; a gate electrode filling the trench above the second insulating film; a first main electrode connected to the second semiconductor region; and a second main electrode provided on a side opposite to the major surface of the semiconductor layer, wherein a portion of the first insulating film in contact with the semiconductor layer is opened, and the semiconductor layer is in contact with the third semiconductor region through the opened portion.

According to other aspect of the invention, there is provided a semiconductor device including: a semiconductor layer of a first conductivity type; a first semiconductor region of a second conductivity type provided on a major surface of the semiconductor layer; a second semiconductor region of the first conductivity type provided in a surface portion of the first semiconductor region; a trench extending through the second semiconductor region and the first semiconductor region to the semiconductor layer; a first insulating film provided on an inner wall of the trench, a portion of the first insulating film in contact with the semiconductor layer having an opening; a third semiconductor region of the second conductivity type filling the trench below an interface between the semiconductor layer and the first semiconductor region and being in contact with the semiconductor layer through the opening formed in the portion of the first insulating film; a second insulating film provided on the third semiconductor region; a gate electrode filling the trench above the second insulating film; a first main electrode connected to the second semiconductor region; a second main electrode provided on a side opposite to the major surface of the semiconductor layer; a plurality of terminal semiconductor regions of the second conductivity type filling terminal trenches and juxtaposed with the semiconductor layer being interposed therebetween, the terminal trenches being formed in the semiconductor layer in a terminal section outside a device section in which the gate electrode, the first semiconductor region, and the second semiconductor region are formed; and an interlayer insulating film provided adjacent to an outermost semiconductor region of the plurality of terminal semiconductor regions and buried on the major surface side of the semiconductor layer.

According to other aspect of the invention, there is provided a semiconductor device including: a semiconductor layer of a first conductivity type; a first semiconductor region of a second conductivity type provided on a major surface of the semiconductor layer; a second semiconductor region of the first conductivity type provided in a surface portion of the first semiconductor region; a trench extending through the second semiconductor region and the first semiconductor region to the semiconductor layer; a gate insulating film provided on an inner wall of the trench; a gate electrode filling the trench via the gate insulating film; a first main electrode connected to the second semiconductor region; a second main electrode provided on a side opposite to the major surface of the semiconductor layer; a plurality of terminal semiconductor regions of the second conductivity type filling terminal trenches and juxtaposed with the semiconductor layer being interposed therebetween, the terminal trenches being formed in the semiconductor layer in a terminal section outside a device section in which the gate electrode, the first semiconductor region, and the second semiconductor region are formed; and an interlayer insulating film provided adjacent to an outermost semiconductor region of the plurality of terminal semiconductor regions and buried on the major surface side of the semiconductor layer.

DETAILED DESCRIPTION OF THE INVENTION

Embodiments of the invention will now be described with reference to the drawings.

First Embodiment

Figure 1:
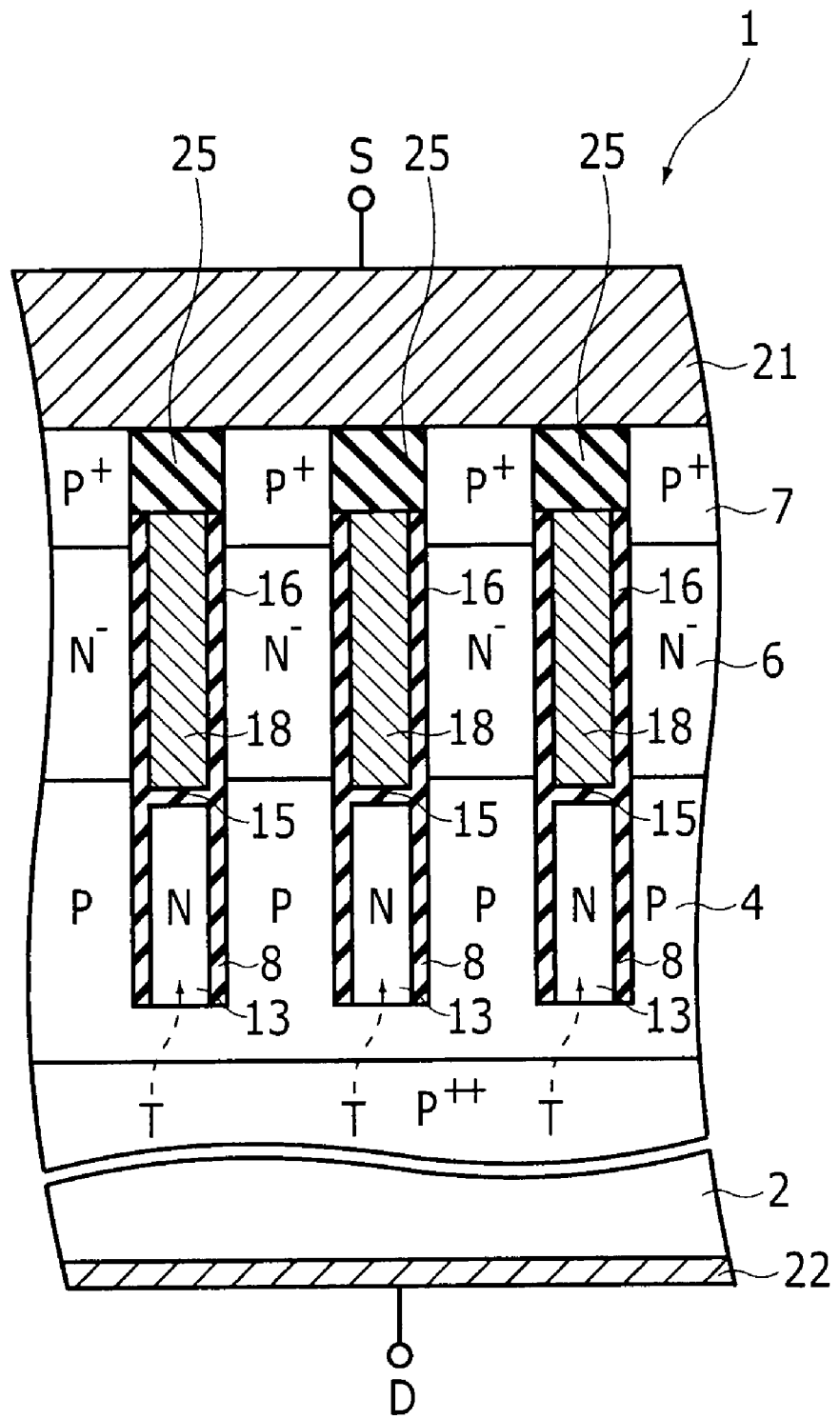
FIG. 1 is a schematic view illustrating the cross-sectional structure of the main part of a semiconductor device according to a first embodiment of the invention.

FIG. 1 is a schematic view illustrating the cross-sectional structure of the main part of a semiconductor device 1 according to a first embodiment of the invention.

Figure 2:
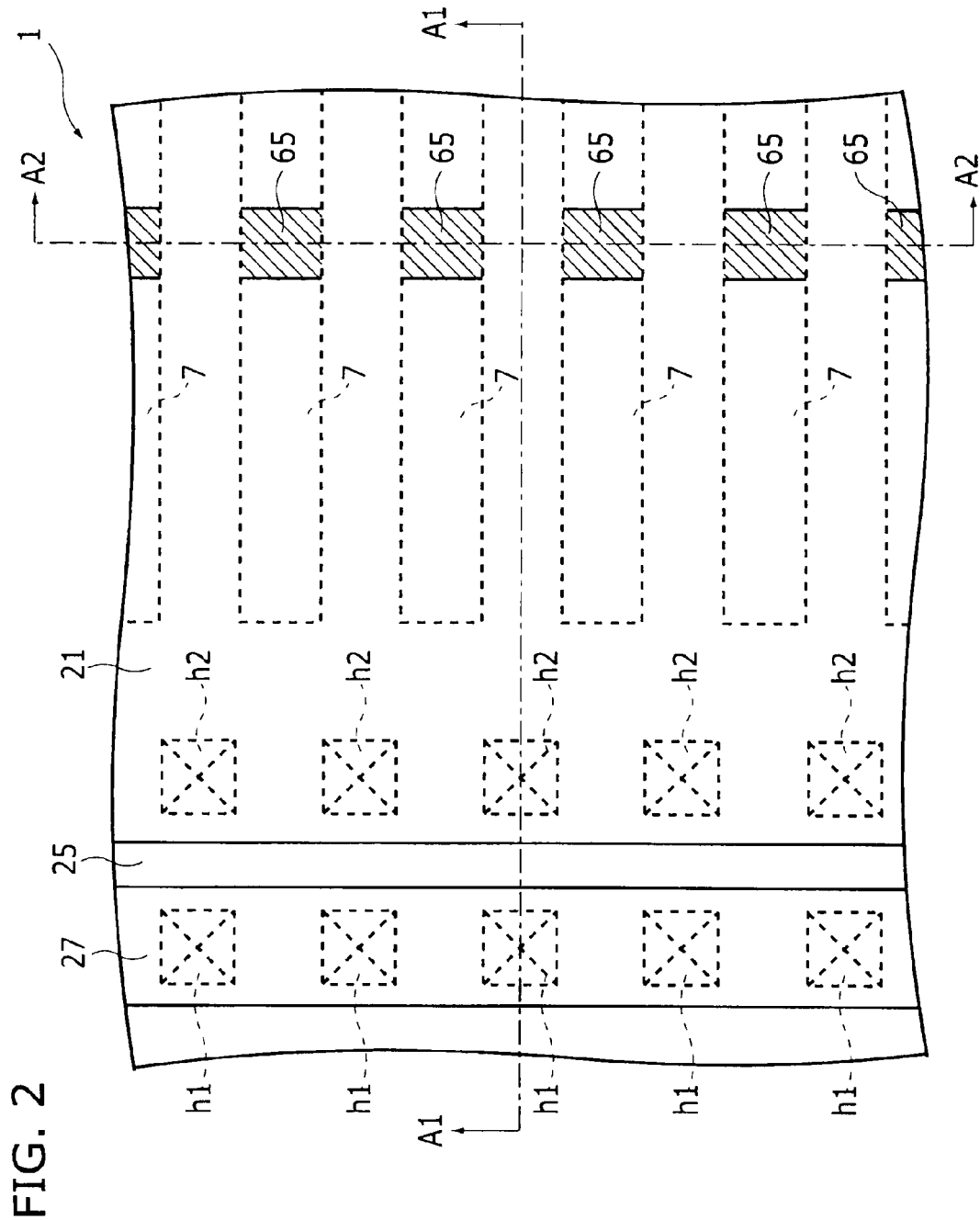
FIG. 2 is a schematic view illustrating the planar structure of the main part of the semiconductor device according to the first embodiment.

FIG. 2 is a schematic view illustrating the planar structure of the main part of the semiconductor device 1.

Figure 3:
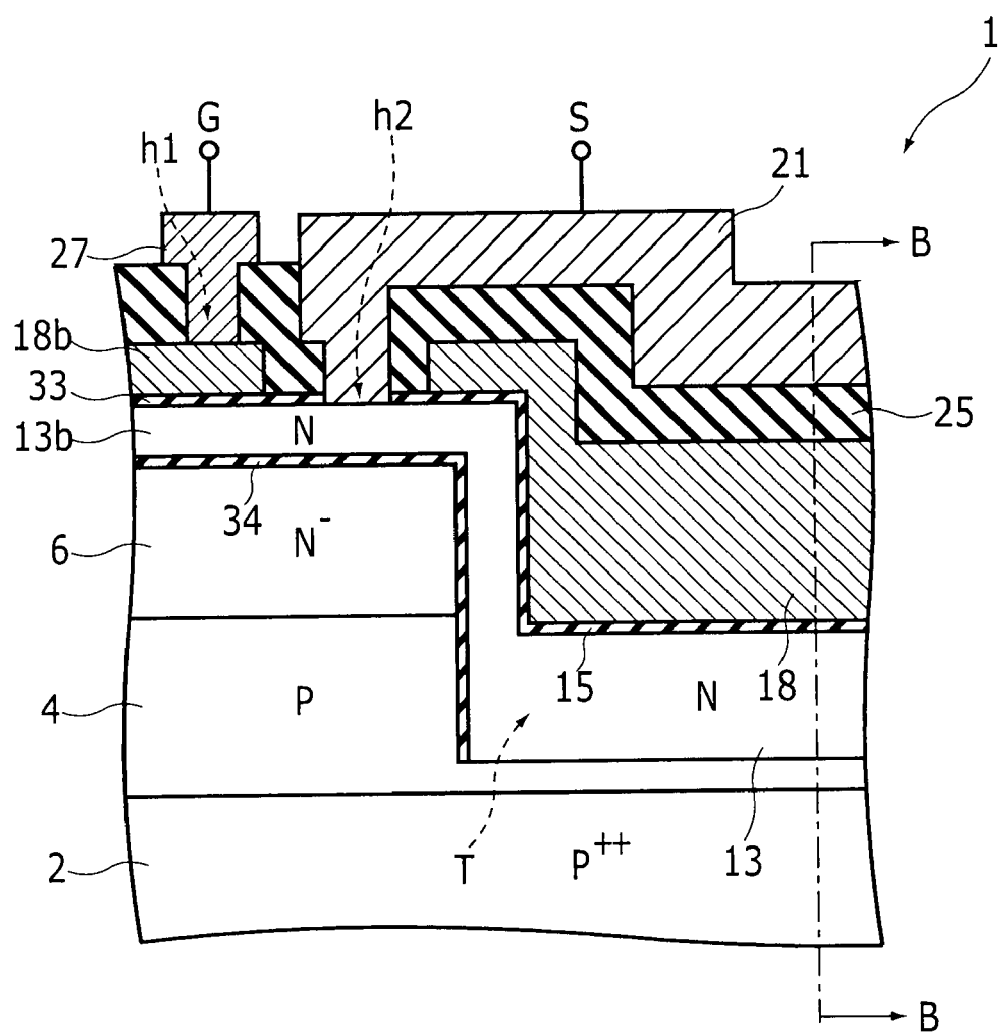
FIG. 3 is a cross-sectional view taken along line A1-A1 in FIG. 2.

FIG. 3 is a cross-sectional view taken along line A1-A1 in FIG. 2. FIG. 1 shows a cross section taken along line B-B in FIG. 3.

Figure 4:
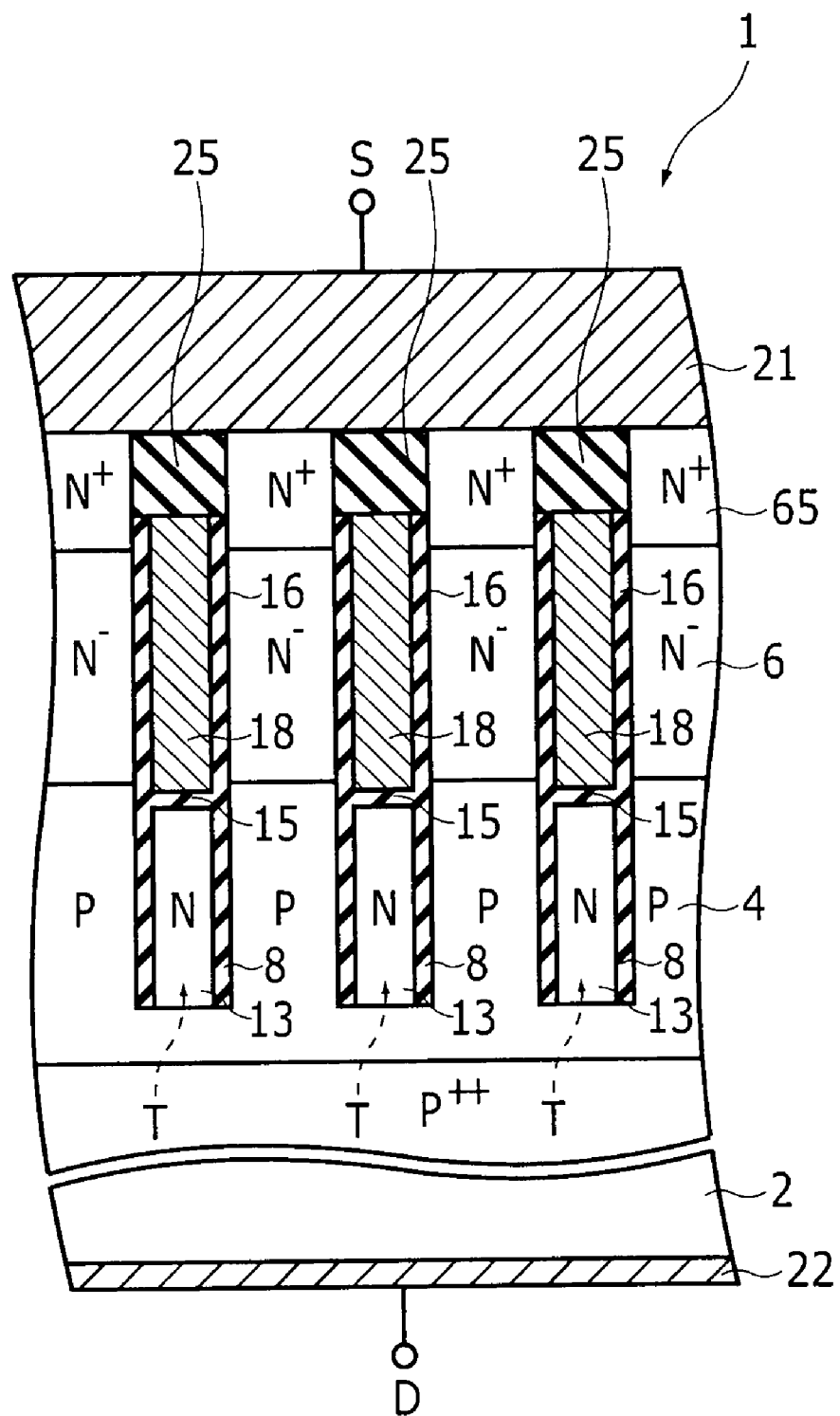
FIG. 4 is a cross-sectional view taken along line A2-A2 in FIG. 2.

FIG. 4 is a cross-sectional view taken along line A2-A2 in FIG. 2.

This embodiment is described assuming the first conductivity type as P-type and the second conductivity type as N-type.

On a major surface of a $P^{++}$-type silicon substrate 2, a semiconductor layer (drift layer or drain layer) 4 of P-type silicon and a first semiconductor region (base region) 6 of $N^-$-type silicon are successively provided. A p-n junction is formed between the semiconductor layer 4 and the first semiconductor region 6.

Trenches T are provided to extend through the first semiconductor region 6 to the semiconductor layer 4. The trench T extends in the direction going through the page in FIG. 1 and is provided generally perpendicular to the major surface of the substrate 2. The bottom of the trench T does not reach the substrate 2. An insulating film 8, 16 is formed on the sidewall of the trench T.

Below the interface between the semiconductor layer 4 and the first semiconductor region 6, the trench T is filled with a third semiconductor region 13 of N-type monocrystalline silicon or N-type polysilicon (polycrystalline silicon). The third semiconductor region 13 has a dopant concentration of $10^{18}/cm^3$ or less, for example. Part of the insulating film 8 in contact with the semiconductor layer 4 has an opening through which the semiconductor layer 4 is in contact with the third semiconductor region 13. The dopant concentration in the third semiconductor region 13 being set to $10^{18}/cm^3$ or less is preferable in completely depleting the third semiconductor region 13.

In this embodiment, the insulating film 8 is not provided at the bottom of the trench T where there is an opening. Therefore the N-type third semiconductor region 13 forms a p-n junction with the P-type semiconductor layer 4 at the bottom of the trench T. The bottom of the trench T is formed in a planar configuration, and hence the p-n junction interface between the third semiconductor region 13 and the semiconductor layer 4 also has a planar configuration. The insulating film 8 is interposed between the side face of the third semiconductor region 13 and the semiconductor layer 4. The area of the third semiconductor region 13 covered with the insulating film 8 is larger than the area of the third semiconductor region 13 being in contact with the semiconductor layer 4. To provide an opening in the insulating film 8 at the bottom of the trench T, the bottom of the trench T may be entirely opened as shown in FIG. 1, or part of the bottom may be opened. For example, the insulating film 8 may be extended to the bottom of the trench T, and only the vicinity of the center of the bottom may be left open.

An insulating film 15 is provided above the third semiconductor region 13, and the trench T is filled with a gate electrode 18 above the insulating film 15. The upper end of the insulating film 15 is located slightly below the interface between the semiconductor layer 4 and the first semiconductor region 6. The gate electrode 18 is electrically insulated from the third semiconductor region 13 by the insulating film 15. An insulating film 16 is interposed between the gate electrode 18 and the first semiconductor region 6. The gate electrode 18 is made of $P^+$-type polysilicon, for example, but is not limited thereto. Other semiconductors and metals can also be used.

In the surface portion of the first semiconductor region 6 is provided a second semiconductor region 7 of $P^+$-type silicon. The interface between the first semiconductor region 6 and the second semiconductor region 7 is located slightly below the upper end of the gate electrode 18. The insulating film 16 is interposed between the gate electrode 18 and the second semiconductor region 7.

The second semiconductor region 7 is connected to a first main electrode (source electrode) 21. The first main electrode 21 is electrically insulated from the gate electrode 18 by an interlayer insulating film 25. A second main electrode (drain electrode) 22 is provided on the surface opposite to the major surface of the substrate 2.

As shown in FIG. 3, the gate electrode 18 and the third semiconductor region 13 have extraction portions 18b and 13b, respectively, extracted in the same direction. An insulating film 33 is interposed between the extraction portion 18b of the gate electrode 18 and the extraction portion 13b of the third semiconductor region 13. An insulating film 34 is interposed between the extraction portion 13b of the third semiconductor region 13 and the first semiconductor region 6.

The extraction portion 18b of the gate electrode 18 is connected to a gate extraction interconnect 27 through a connection hole h1 formed in the interlayer insulating film 25. The extraction portion 13b of the third semiconductor region 13 is connected to the first main electrode 21 through a connection hole h2 passing through the extraction portion 18b of the gate electrode 18 and the interlayer insulating film 25. The interlayer insulating film 25 is interposed between the first main electrode 21 filling the connection hole h2 and the extraction portion 18b of the gate electrode 18 to electrically insulate the first main electrode 21 from the gate electrode 18.

In the semiconductor device 1 configured as above, when a prescribed bias voltage is applied to the gate electrode 18, a channel is formed in the first semiconductor region 6 opposed to the gate electrode 18 via the insulating film 16. Thus the path between the first main electrode 21 and the second main electrode 22 is turned on.

The semiconductor device 1 of this embodiment has a so-called super junction structure on the bottom side of the trenches T where P-type regions and N-type regions are repeatedly juxtaposed and form p-n junctions through the bottom of the trenches T. Depletion of the semiconductor layer 4 and the third semiconductor region 13 can be facilitated through the bottom of the trench T serving as a p-n junction. Therefore, even when the dopant concentration in the semiconductor layer 4 serving as a drift layer for passing current is increased for reducing ON resistance, the semiconductor layer 4 and the third semiconductor region 13 can be completely depleted, and the decrease of withstand voltage during application of drain-source voltage can be prevented. That is, a semiconductor device 1 having high withstand voltage and low ON resistance is provided.

The insulating film 8 interposed between the side face of the third semiconductor region 13 and the semiconductor layer 4 can prevent dopant in one of the third semiconductor region 13 and the semiconductor layer 4 from diffusing into the other. Thus it is possible to prevent the variation of dopant concentration in the current path and the resulting increase of ON resistance.

Because the p-n junction at the bottom of the trench T is a junction of materials of the same kind (silicon), leak current is less likely to occur.

For example, the semiconductor device of this embodiment is configured so that the dopant concentration in the semiconductor layer 4 is $2.8 \times 10^{17}/cm^3$, the pitch of the trenches T is 0.5 micrometer, the width of the trench T along the arranged direction is 0.3 micrometer, the depth of the portion of the trench T filled with the third semiconductor region 13 is 1 micrometer, and the length from the upper end of the third semiconductor region 13 to the upper end of the second semiconductor region 7 is 1.2 micrometers. A withstand voltage of 36 V was achieved for this semiconductor device. However, the withstand voltage was only 7 V in the configuration where the insulating film is formed also at the bottom of the trench T and there is no junction between the semiconductor layer 4 and the third semiconductor region 13.

In the present embodiment, as shown in FIG. 2 and FIG. 4 that shows the A2-A2 cross section in FIG. 2, an $N^+$-type back gate region 65 is provided so as to divide the source region 7. The back gate region 65 is connected to the source electrode 21. This can facilitate releasing carriers through the back gate region 65 to the source electrode 21 and prevent device destruction.

Note that the configuration of the back gate region 65 is not limited to dividing the source region 7. It is sufficient if a carrier releasing path from the base region 6 to the source electrode 21 can be established. Thus the back gate region 65 can be provided in any way if the base region 6 is electrically connected to the source electrode 21 through the back gate region 65.

Next, an example method for manufacturing a semiconductor device 1 is described.

FIGS. 5 to 12 are process cross-sectional views illustrating the main part of a process of manufacturing a semiconductor device 1.

Figure 5:
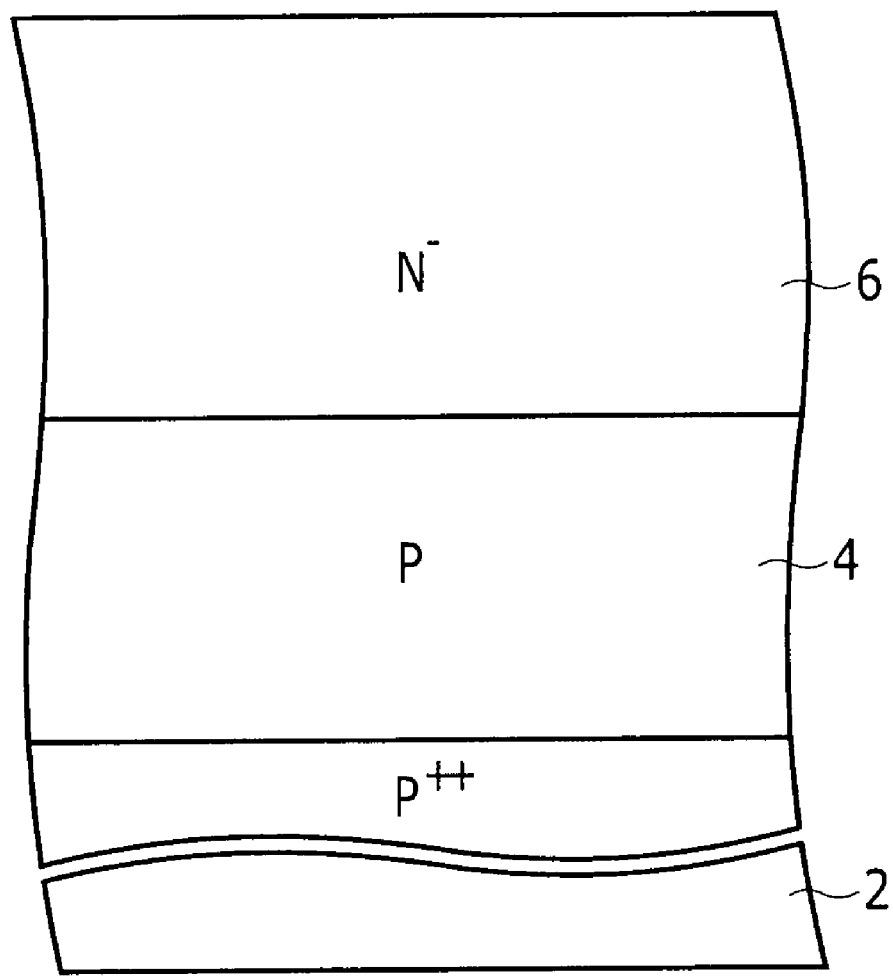
FIGS. 5 to 12 are process cross-sectional views illustrating the main part of a process of manufacturing a semiconductor device according to the first embodiment.

As shown in FIG. 5, on a $P^{++}$-type silicon substrate 2 having a high dopant concentration, a semiconductor layer 4 of P-type silicon and a first semiconductor region 6 of $N^-$-type silicon are successively formed.

Figure 6:
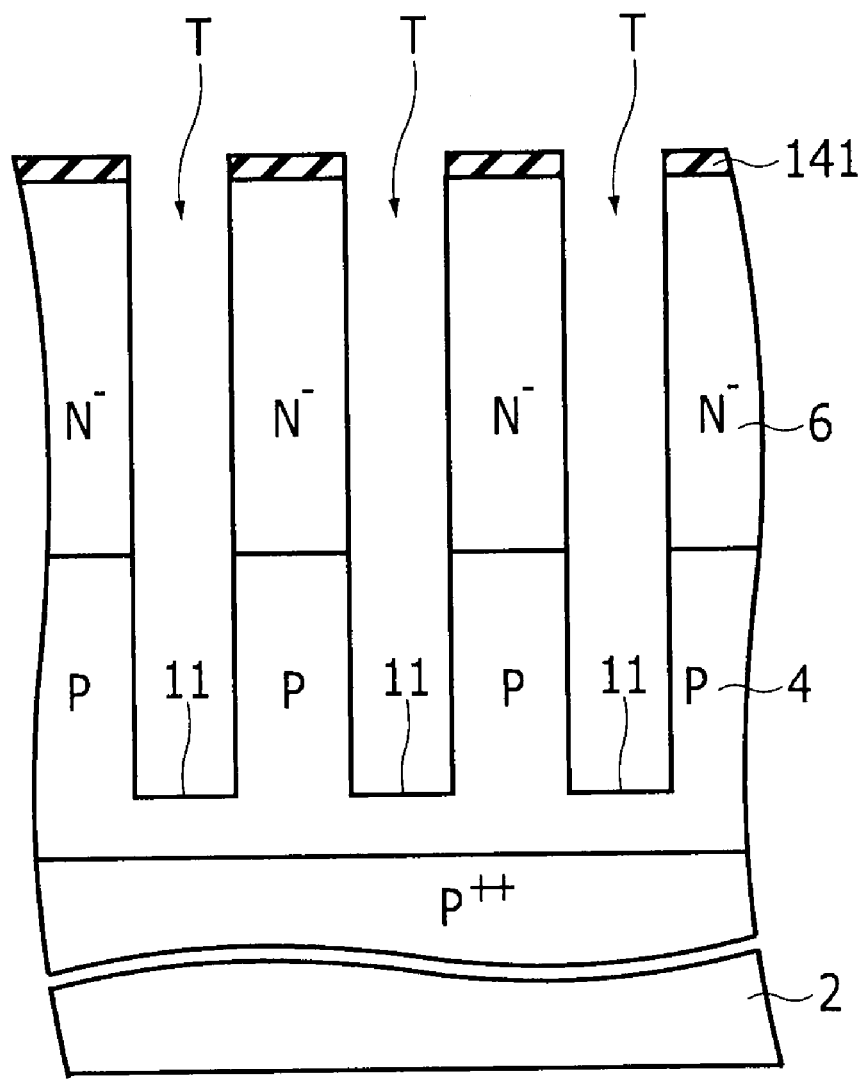

Next, as shown in FIG. 6, an oxide film 141 selectively formed on the surface of the first semiconductor region 6 is used as a mask to form trenches T extending through the first semiconductor region 6 to the semiconductor layer 4 by anisotropic etching such as RIE (Reactive Ion Etching). The bottom of the trench T does not reach the substrate 2.

Figure 7:
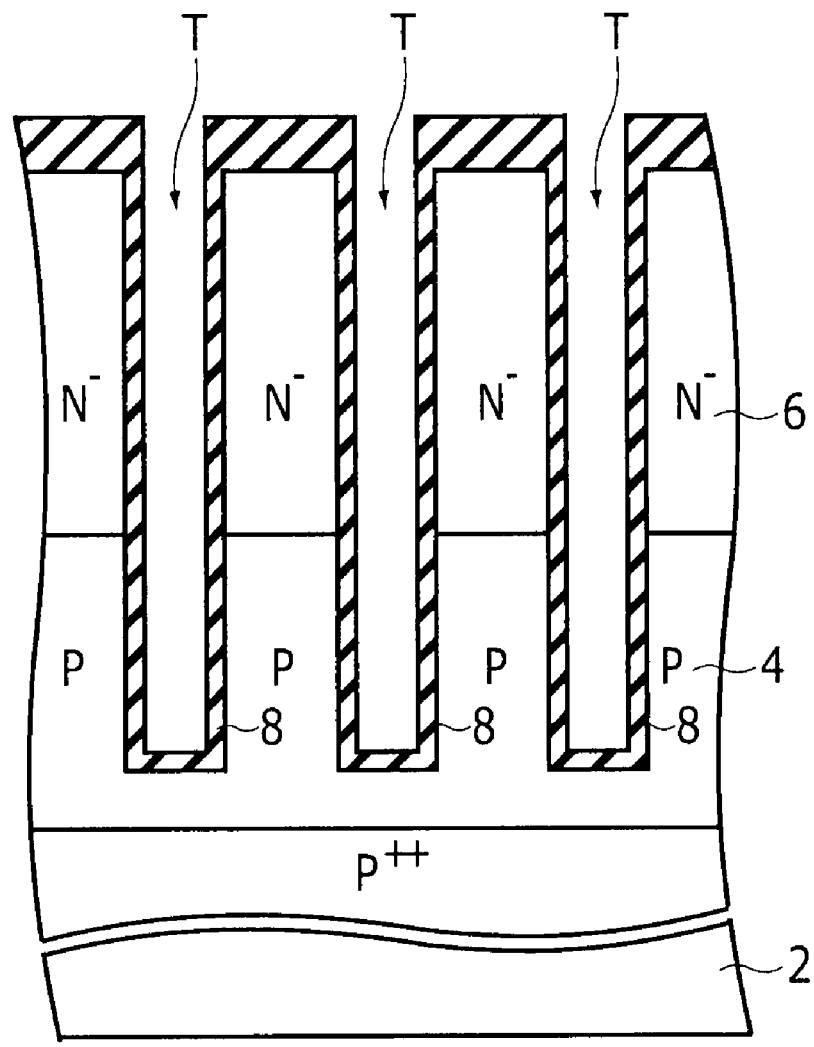

Next, as shown in FIG. 7, an insulating film 8 is formed on the inner wall (sidewall and bottom face) of the trench T. The insulating film 8 is a silicon oxide film formed by thermal oxidation, for example.

Figure 8:
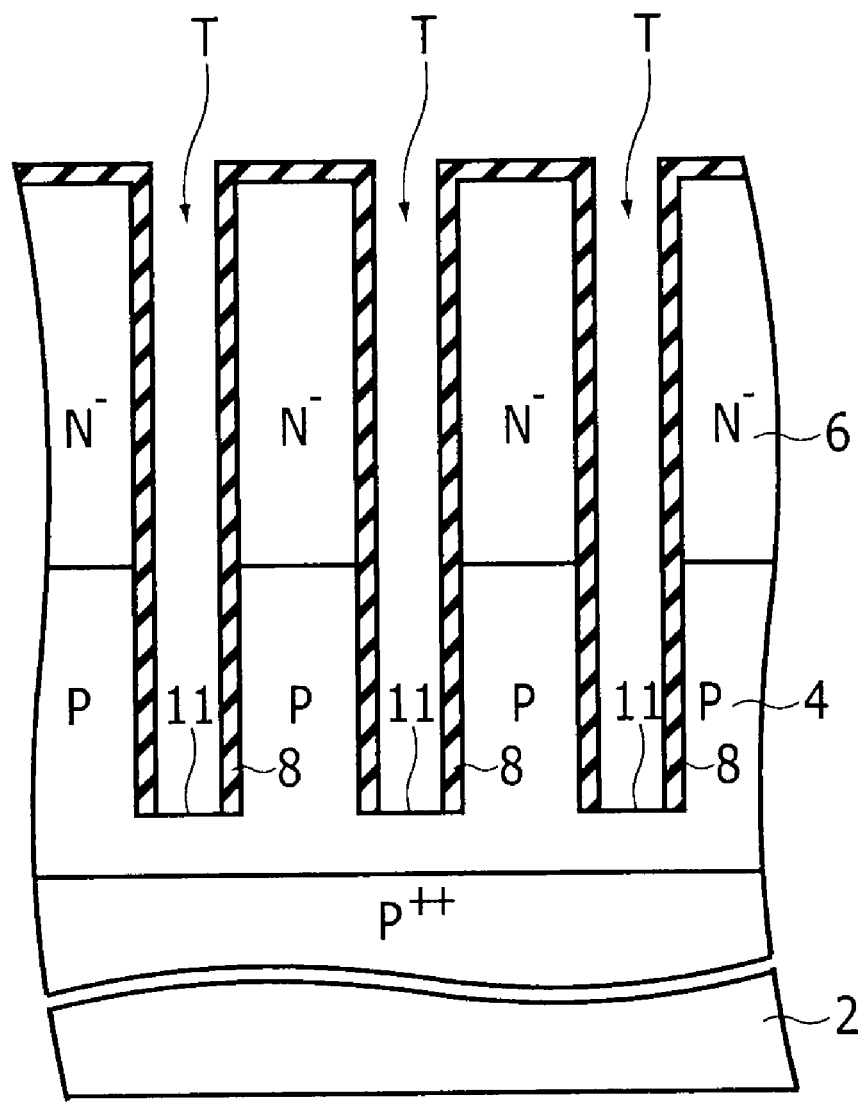

Next, as shown in FIG. 8, the insulating film 8 exclusively at the bottom 11 of the trench T is removed by anisotropic etching such as RIE. Thus the semiconductor layer 4 is exposed inside the trench T through the bottom 11 of the trench T where the insulating film 8 is removed.

At this time, the bottom 11 of the trench T can be etched to have a planar configuration. Then the p-n junction to be formed between a third semiconductor region 13 filling the bottom side of the trench T and the semiconductor layer 4 has a planar interface, which facilitates complete depletion.

Next, the trench T is completely buried with N-type polysilicon by CVD (Chemical Vapor Deposition) using a silicon source gas and an N-type dopant source gas, for example. Then the polysilicon is etched back to a position below the interface between the semiconductor layer 4 and the first semiconductor region 6.

Figure 9:
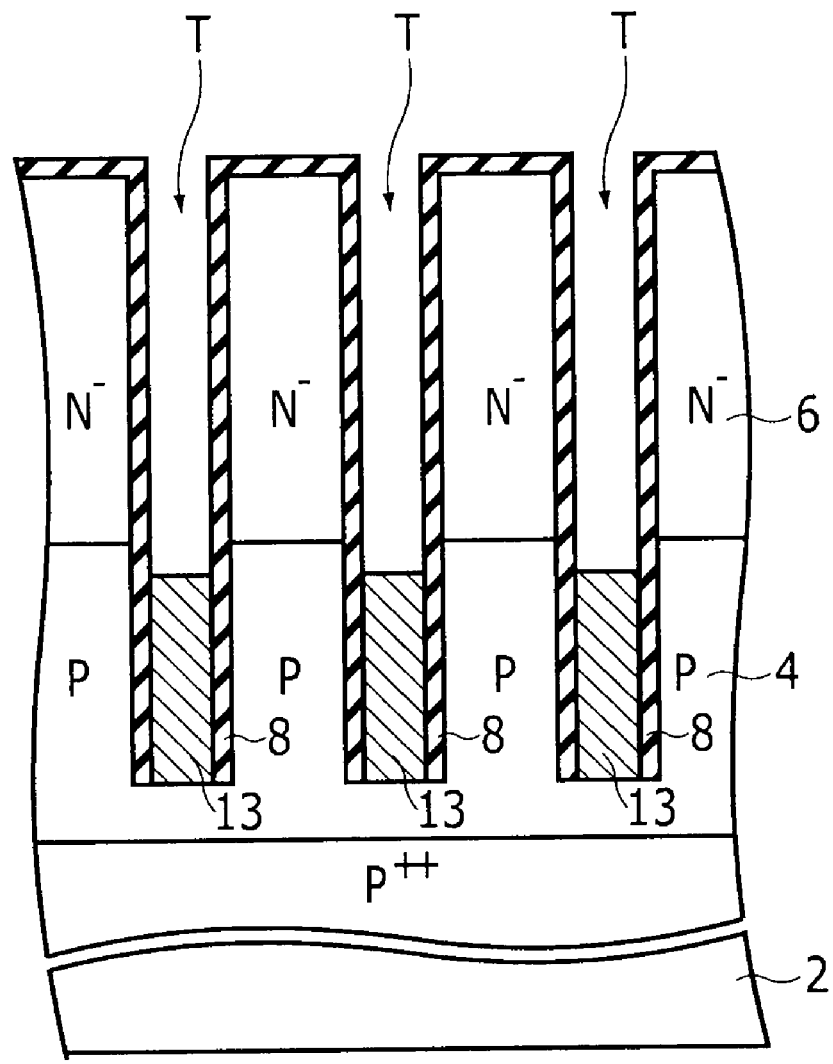

Thus, as shown in FIG. 9, a third semiconductor region 13 of N-type polysilicon filling the trench T is formed below the interface between the semiconductor layer 4 and the first semiconductor region 6.

Note that the third semiconductor region 13 may be formed by another method. Specifically, after the trench T is buried with polysilicon, N-type dopant is implanted into the polysilicon. Then the implanted N-type dopant is diffused by heat treatment to form N-type polysilicon, which is etched back to a position below the interface between the semiconductor layer 4 and the first semiconductor region 6, thereby completing the third semiconductor region 13. Even for a fine trench T (i.e., with a large aspect ratio), the trench T can be easily buried with polysilicon.

When the third semiconductor region 13 is formed, dopant diffusion between the third semiconductor region 13 and the semiconductor layer 4 is prevented because the insulating film 8 has already been provided between the side face of the third semiconductor region 13 and the semiconductor layer 4. Thus it is possible to prevent the variation of dopant concentration in the current path and the resulting increase of ON resistance. Furthermore, it is easy to desirably control the dopant concentration in the third semiconductor region 13 even if the trenches T have a fine pitch.

Figure 10:
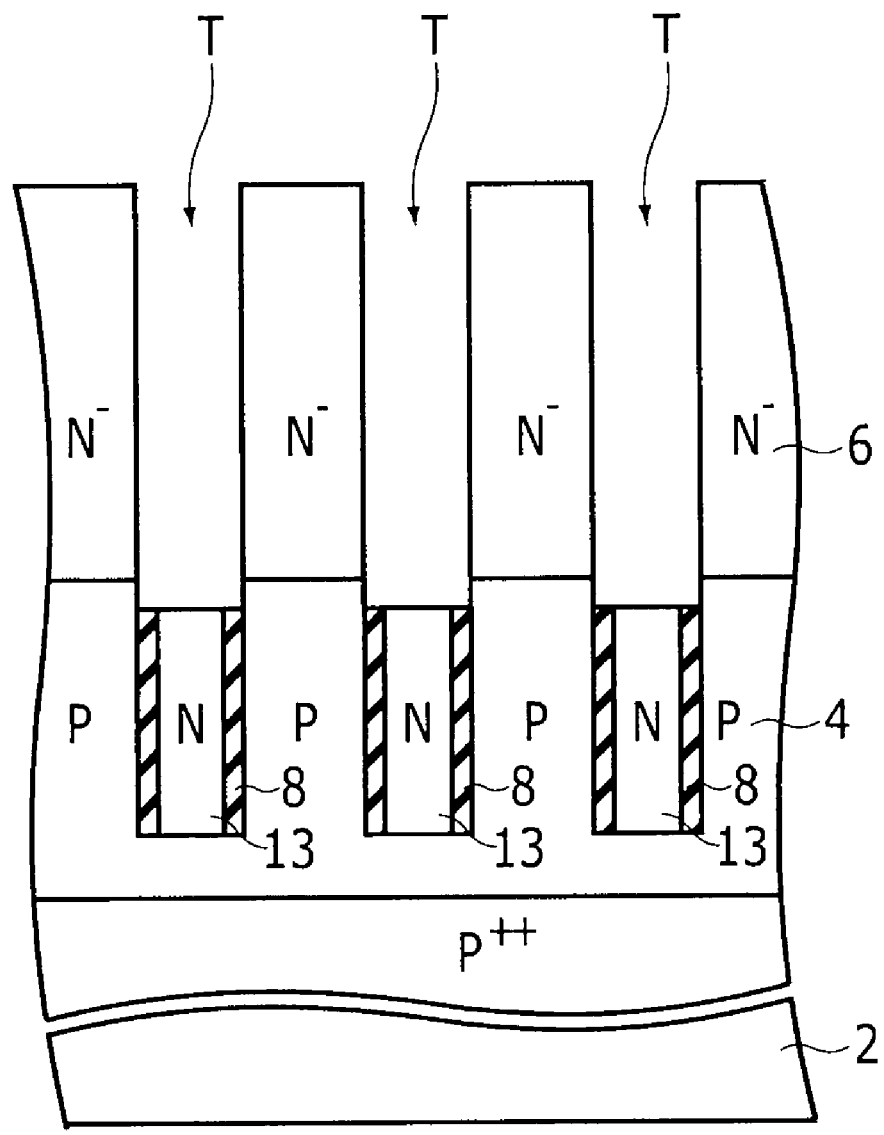

Next, as shown in FIG. 10, etching is used to remove the insulating film 8 formed on the sidewall of the portion of the trench T above the third semiconductor region 13, that is, the portion that is not filled with the third semiconductor region 13.

Figure 11:
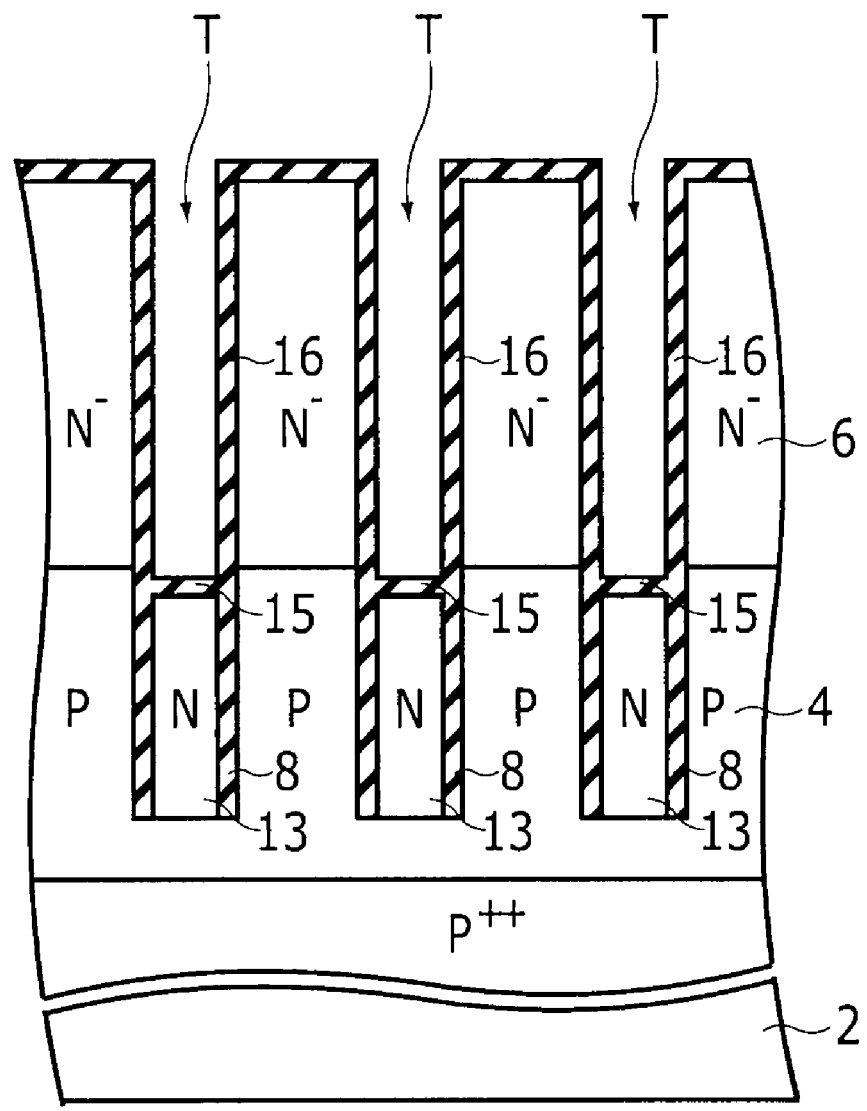

Next, as shown in FIG. 11, an insulating film 15 is formed on the third semiconductor region 13, and an insulating film 16 is formed on the sidewall of the trench T above the third semiconductor region 13. The insulating films 15, 16 are silicon oxide films formed by thermal oxidation, for example.

Next, after the trench T above the insulating film 15 is buried with polysilicon, P-type dopant is implanted into the polysilicon. Then the implanted P-type dopant is diffused by heat treatment to form $P^+$-type polysilicon, which is etched back to a position below the opening at the upper end of the trench T.

Figure 12:
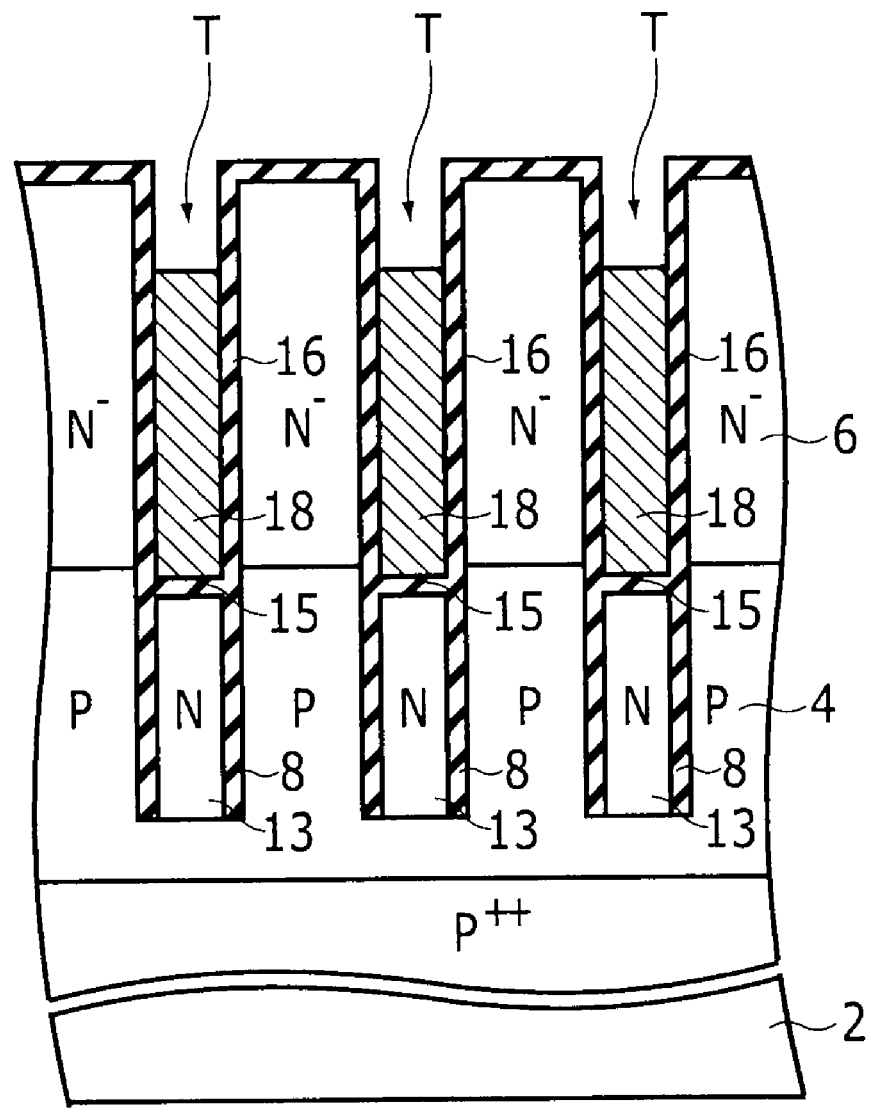

Thus, as shown in FIG. 12, a gate electrode 18 of $P^+$-type polysilicon is formed, which faces the first semiconductor region 6 across the insulating film 16. Note that the gate electrode 18 may be of N-type, or semiconductor other than silicon. Furthermore, the gate electrode 18 is not limited to semiconductor, but may be made of metal.

Next, an interlayer insulating film 25 is formed. The interlayer insulating film 25 fills the trench T above the gate electrode 18 as shown in FIG. 1 and overlies the extraction portion 18b of the gate electrode 18 as shown in FIG. 3. The interlayer insulating film 25 is a silicon oxide film, for example.

Next, the surface of the first semiconductor region 6 around the trench T is subjected to ion implantation and thermal diffusion of P-type dopant. Thus a second semiconductor region 7 of $P^+$-type silicon is formed in the surface portion of the first semiconductor region 6 around the trench T.

Next, a first main electrode 21 of aluminum is formed on the second semiconductor region 7 and the interlayer insulating film 25 by sputtering, for example. Thus the first main electrode 21 is electrically connected to the second semiconductor region 7. Furthermore, as shown in FIG. 3, the first main electrode 21 is electrically connected to the third semiconductor region 13 through a connection hole formed in the interlayer insulating film 25.

The gate electrode 18 is electrically connected to the gate extraction interconnect 27 through a connection hole formed in the interlayer insulating film 25 as shown in FIG. 3. A second main electrode 22 is formed on the backside of the substrate 2. Thus a semiconductor device 1 shown in FIGS. 1 to 4 is obtained.

In the following, other embodiments of the invention are described. Elements similar to those described earlier are marked with the same reference numerals and not described in detail.

Second Embodiment

The second embodiment is different from the first embodiment in the method of forming the third semiconductor region 13.

In this embodiment again, like the first embodiment, no insulating film is formed at the bottom of the trench T. The semiconductor layer 4 exposed inside the trench T through the bottom of the trench T is used as a base crystal to epitaxially grow N-type silicon. The growth is terminated before reaching the interface between the semiconductor layer 4 and the first semiconductor region 6. Thus a third semiconductor region 13 is formed, which fills the trench T below the interface between the semiconductor layer 4 and the first semiconductor region 6 and forms a junction with the semiconductor layer 4 at the bottom of the trench T.

The epitaxial growth of the third semiconductor region 13 is selective epitaxial growth exclusively onto the semiconductor layer 4 exposed through the bottom of the trench T. Therefore the crystal face (crystal orientation) is aligned, the crystallinity of the third semiconductor region 13 can be improved, and leak current can be reduced. In particular, this embodiment is effective in obtaining the third semiconductor region 13 as a large crystal.

Third Embodiment

Figure 13:
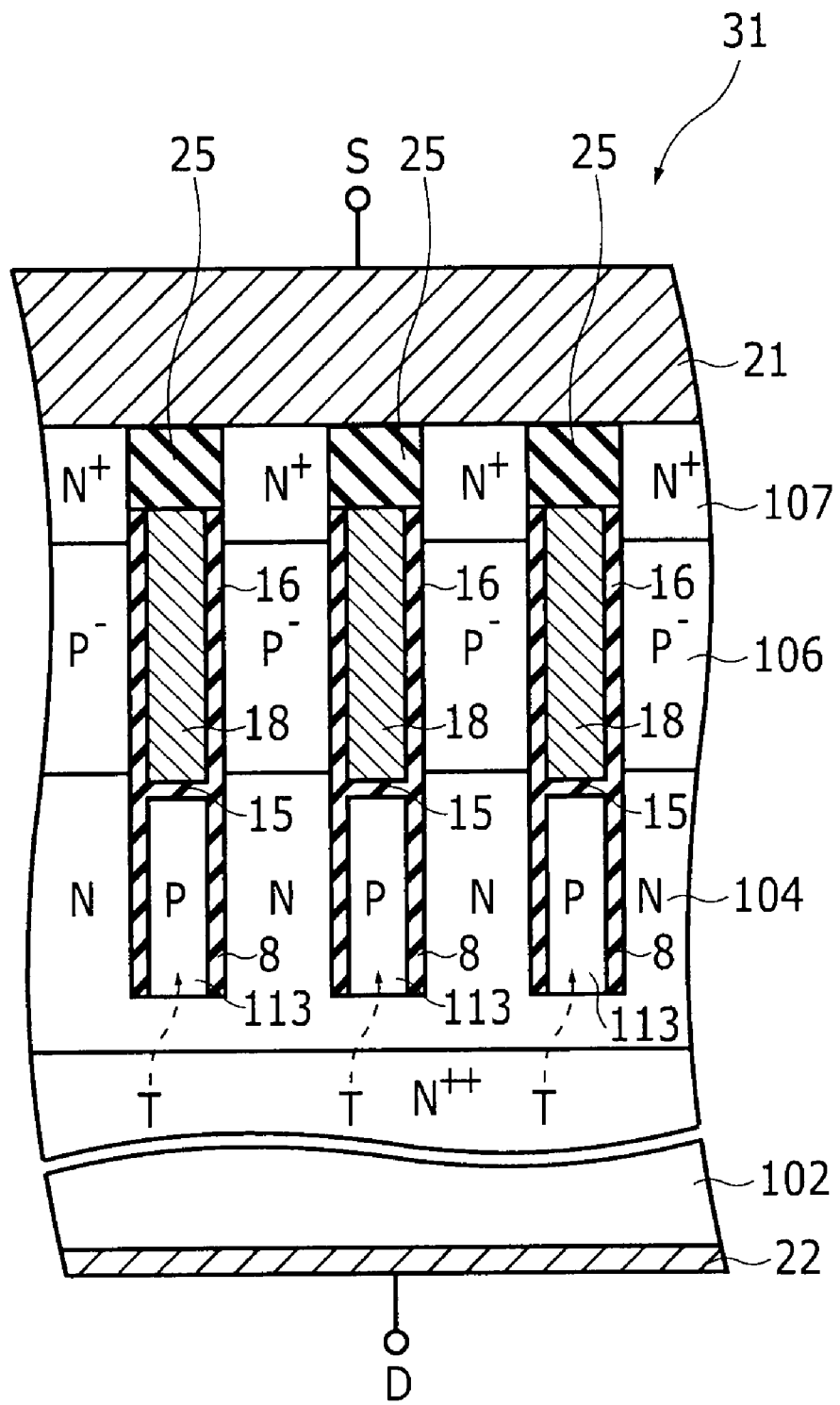
FIG. 13 is a schematic view illustrating the cross-sectional structure of the main part of a semiconductor device according to a third embodiment of the invention.

FIG. 13 is a schematic view illustrating the cross-sectional structure of the main part of a semiconductor device 31 according to a third embodiment of the invention.

In this embodiment, the conductivity type of each element is reversed with respect to the first embodiment. More specifically, assuming the first conductivity type as N-type and the second conductivity type as P-type, the device comprises a substrate 102 of $N^{++}$-type silicon, a semiconductor layer (drift layer) 104 of N-type silicon, a first semiconductor region (base region) 106 of $P^-$-type silicon, a second semiconductor region (source region) 107 of $N^+$-type silicon, a third semiconductor region 113 of P-type silicon or polysilicon, and a gate electrode 118 of $N^+$-type silicon.

In this embodiment again, depletion of the semiconductor layer 104 and the third semiconductor region 113 can be facilitated through the bottom of the trench T serving as a p-n junction. Therefore, even when the dopant concentration in the semiconductor layer 104 is increased for reducing ON resistance, the semiconductor layer 104 and the third semiconductor region 113 can be completely depleted, and the decrease of withstand voltage during application of drain-source voltage can be prevented.

Fourth Embodiment

Figure 14:
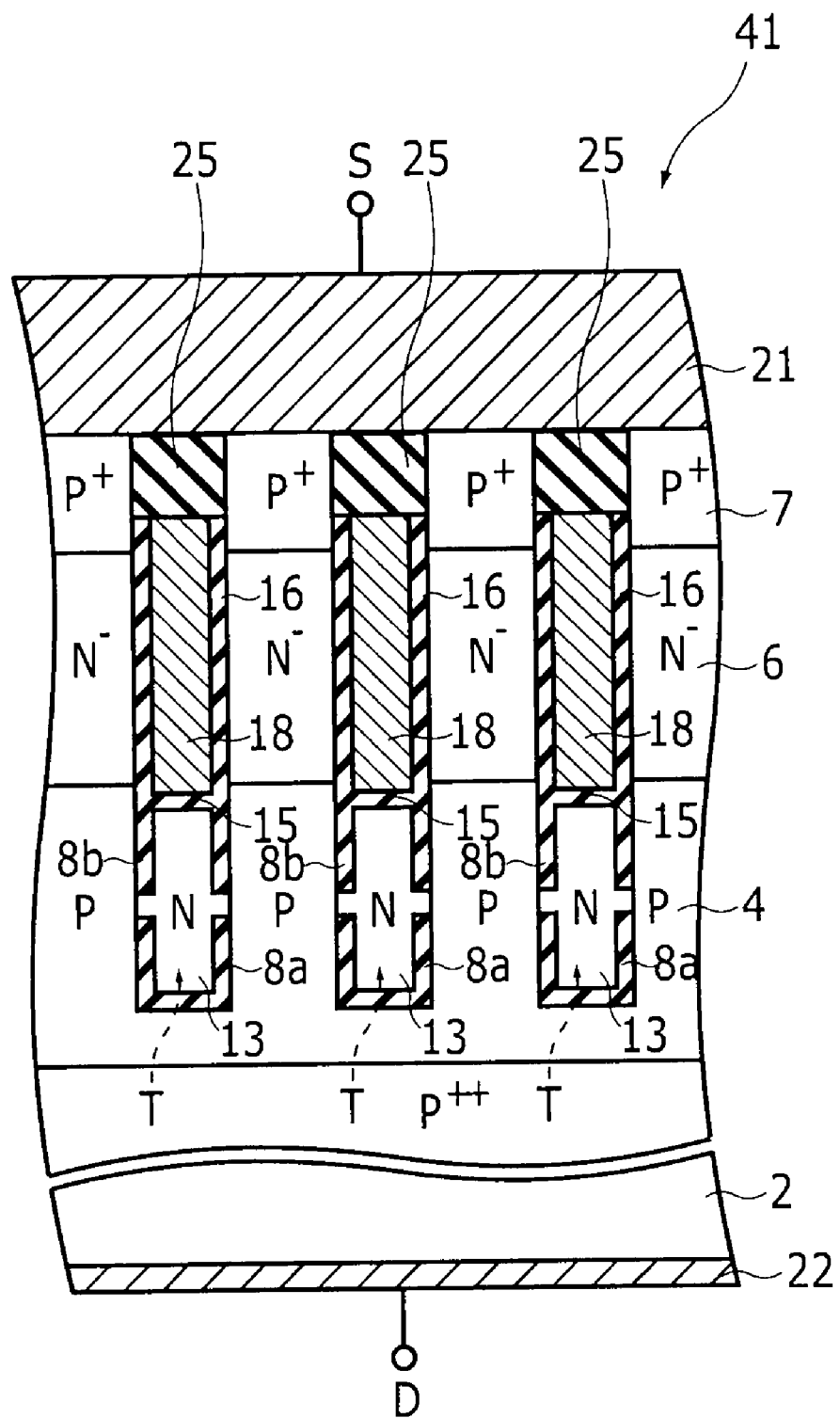
FIG. 14 is a schematic view illustrating the cross-sectional structure of the main part of a semiconductor device according to a fourth embodiment of the invention.

FIG. 14 is a schematic view illustrating the cross-sectional structure of the main part of a semiconductor device 41 according to a fourth embodiment of the invention.

In this embodiment again, like the first embodiment, the trench T below the interface between the semiconductor layer 4 and the first semiconductor region 6 is filled with a third semiconductor region 13 of N-type silicon or N-type polysilicon. A portion of the insulating film in contact with the semiconductor layer 4 is opened, and the semiconductor layer 4 is in contact with the third semiconductor region 13 through the opened portion.

In this embodiment, the insulating film on the side face of the trench T has an opening, and the N-type third semiconductor region 13 forms a p-n junction with the P-type semiconductor layer 4 at the side face of the trench T. From the viewpoint of preventing dopant diffusion between the third semiconductor region 13 and the semiconductor layer 4, the area of the p-n junction therebetween is preferably smaller than the area of the portion of the third semiconductor region 13 covered with insulating films 8a, 8b.

In this embodiment again, depletion of the semiconductor layer 4 and the third semiconductor region 13 can be facilitated through the p-n junction at the side face of the trench T. Therefore, even when the dopant concentration in the semiconductor layer 4 is increased for reducing ON resistance, the semiconductor layer 4 and the third semiconductor region 13 can be completely depleted, and the decrease of withstand voltage during application of drain-source voltage can be prevented.

Next, an example method for manufacturing a semiconductor device 41 is described.

FIGS. 15 to 18 are process cross-sectional views illustrating the main part of a process of manufacturing a semiconductor device 41.

A trench T is formed to extend through the first semiconductor region 6 to the semiconductor layer 4, and an insulating film 8*a* is formed on the inner wall (sidewall and bottom face) of the trench T. These steps are conducted similarly to the first embodiment.

Figure 15:
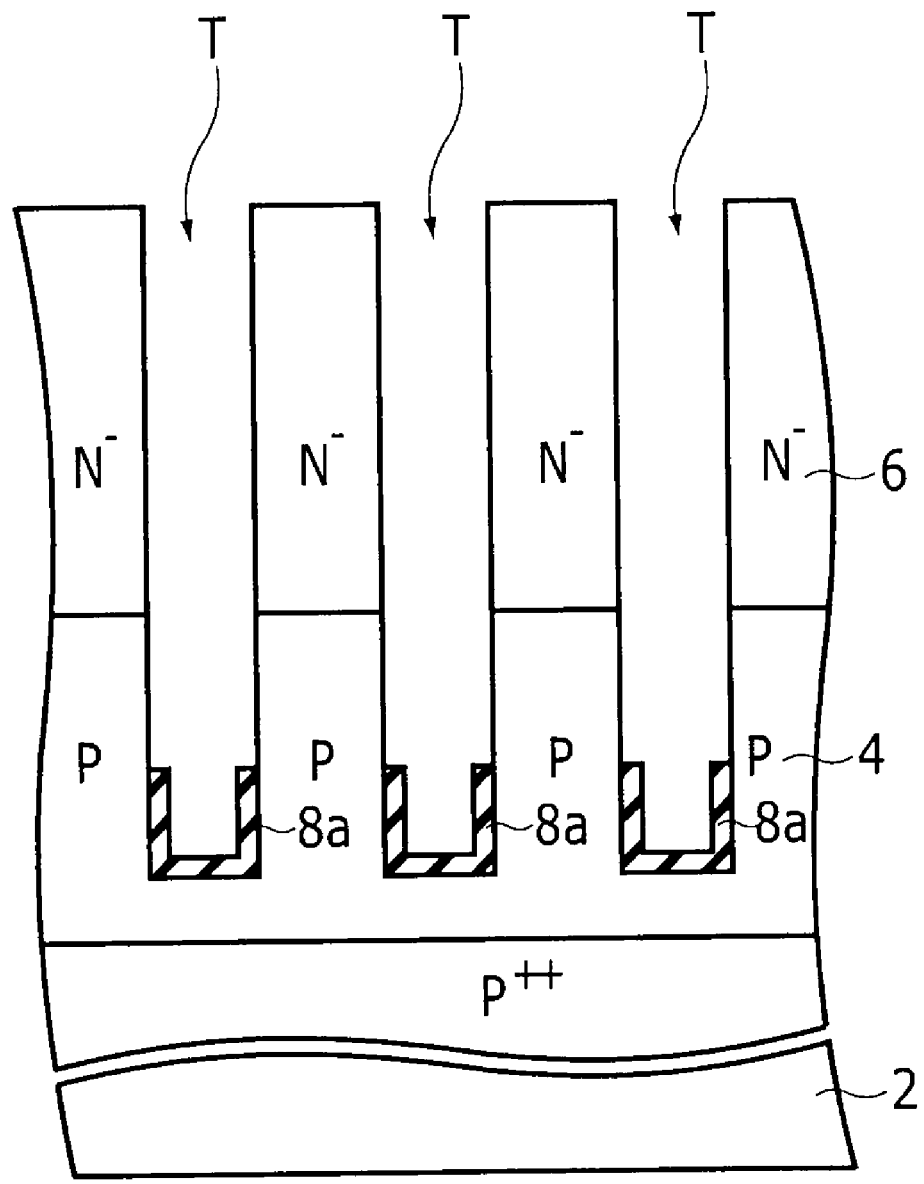
FIGS. 15 to 18 are process cross-sectional views illustrating the main part of a process of manufacturing a semiconductor device according to the fourth embodiment.

Then, as shown in FIG. 15, the insulating film 8*a* is etched so as to leave only the bottom and a portion slightly above the bottom of the trench T.

Figure 16:
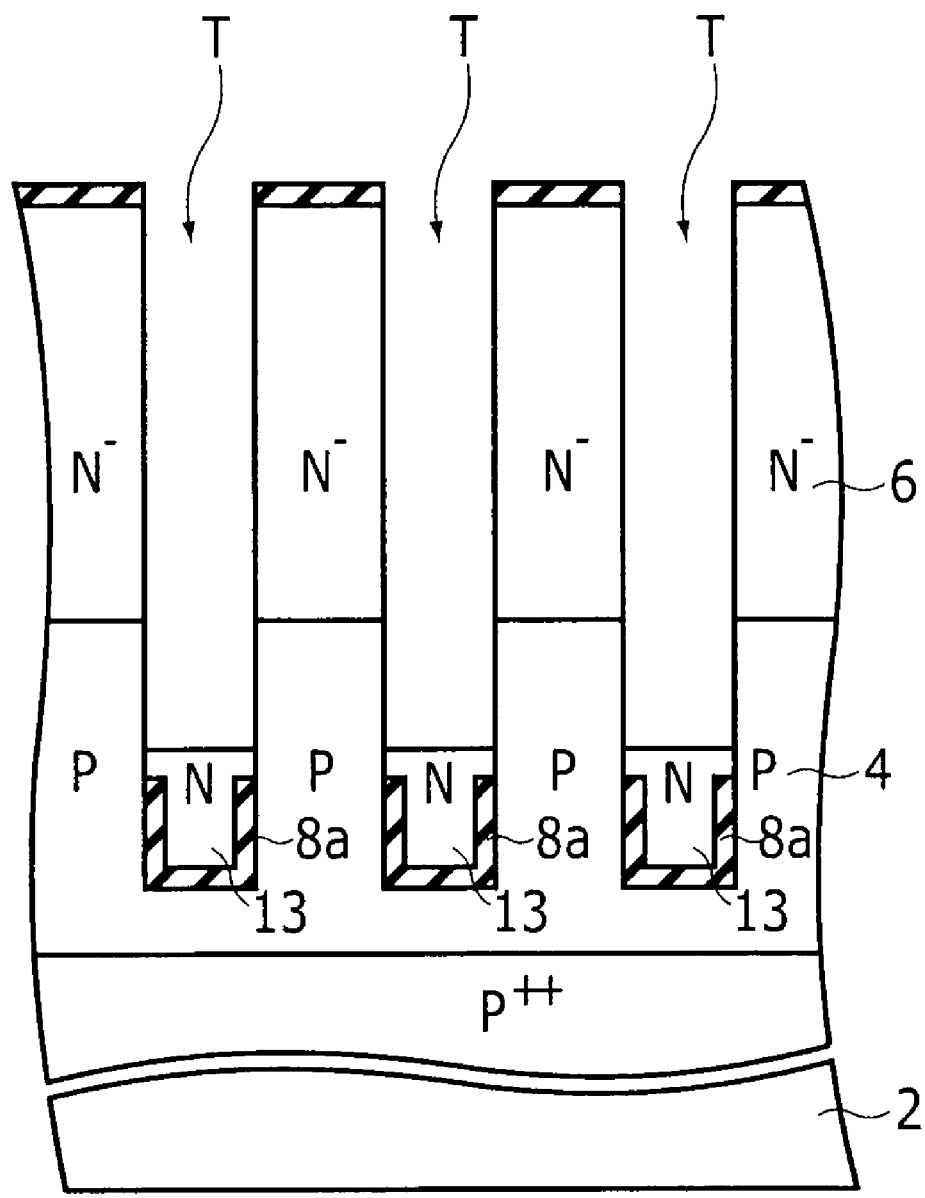

Next, N-type silicon is laterally grown from the side face of the trench T that is not covered with the insulating film 8*a*. Thus, as shown in FIG. 16, a third semiconductor region 13 is formed, which fills the bottom side of the trench T so as to completely cover the insulating film 8*a*.

Figure 17:
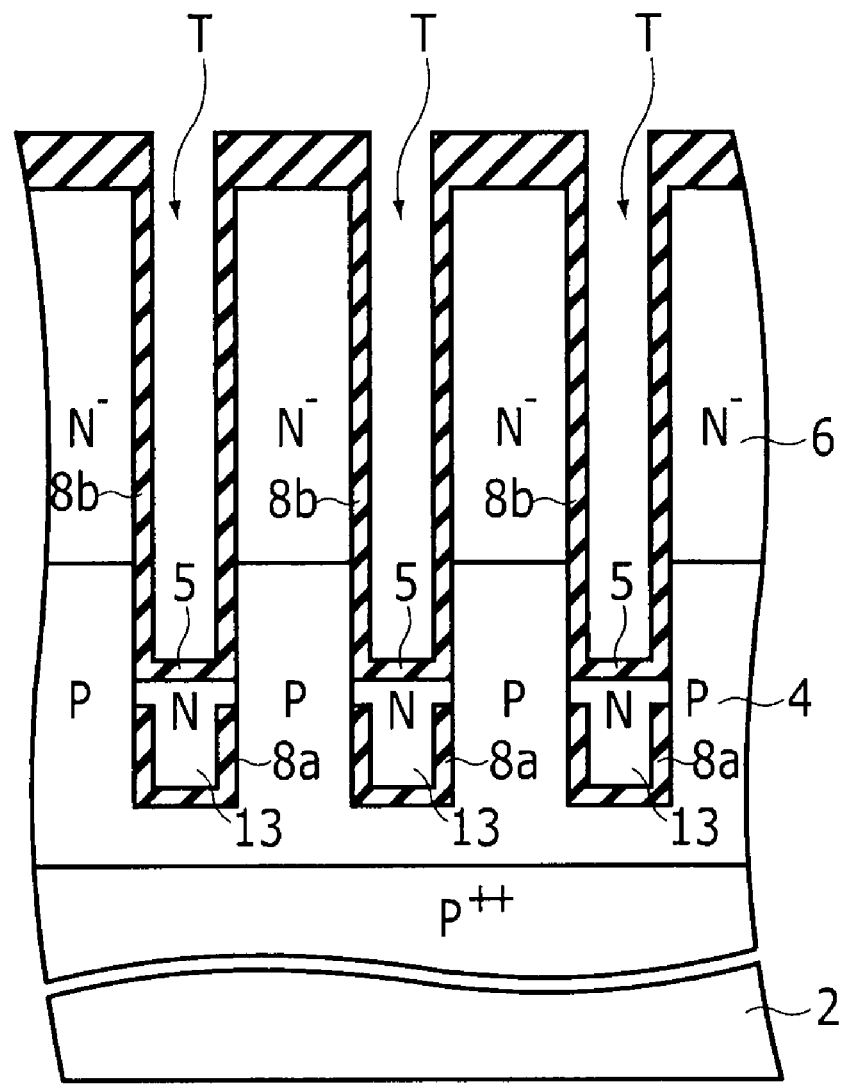

Next, as shown in FIG. 17, an insulating film 5 is formed on the third semiconductor region 13, and an insulating film 8*b* is formed on the sidewall of the trench T above the third semiconductor region 13.

Figure 18:
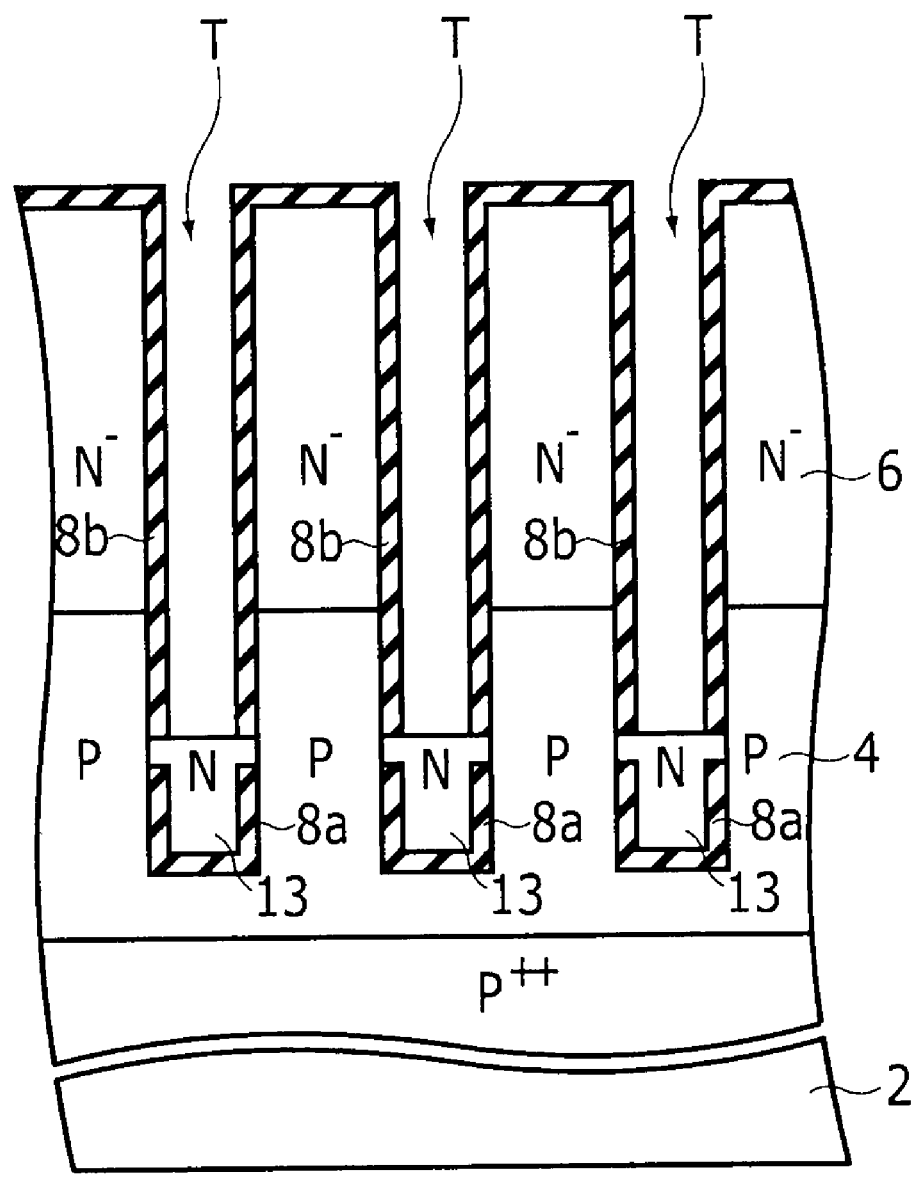

Next, as shown in FIG. 18, the insulating film 5 on the third semiconductor region 13 is removed by anisotropy etching. Then the third semiconductor region 13 is epitaxially grown to a position slightly below the interface between the semiconductor layer 4 and the first semiconductor region 6 as shown in FIG. 14. Subsequently, like the first embodiment, the steps described above are continued from FIG. 11.

Fifth Embodiment

Figure 19:
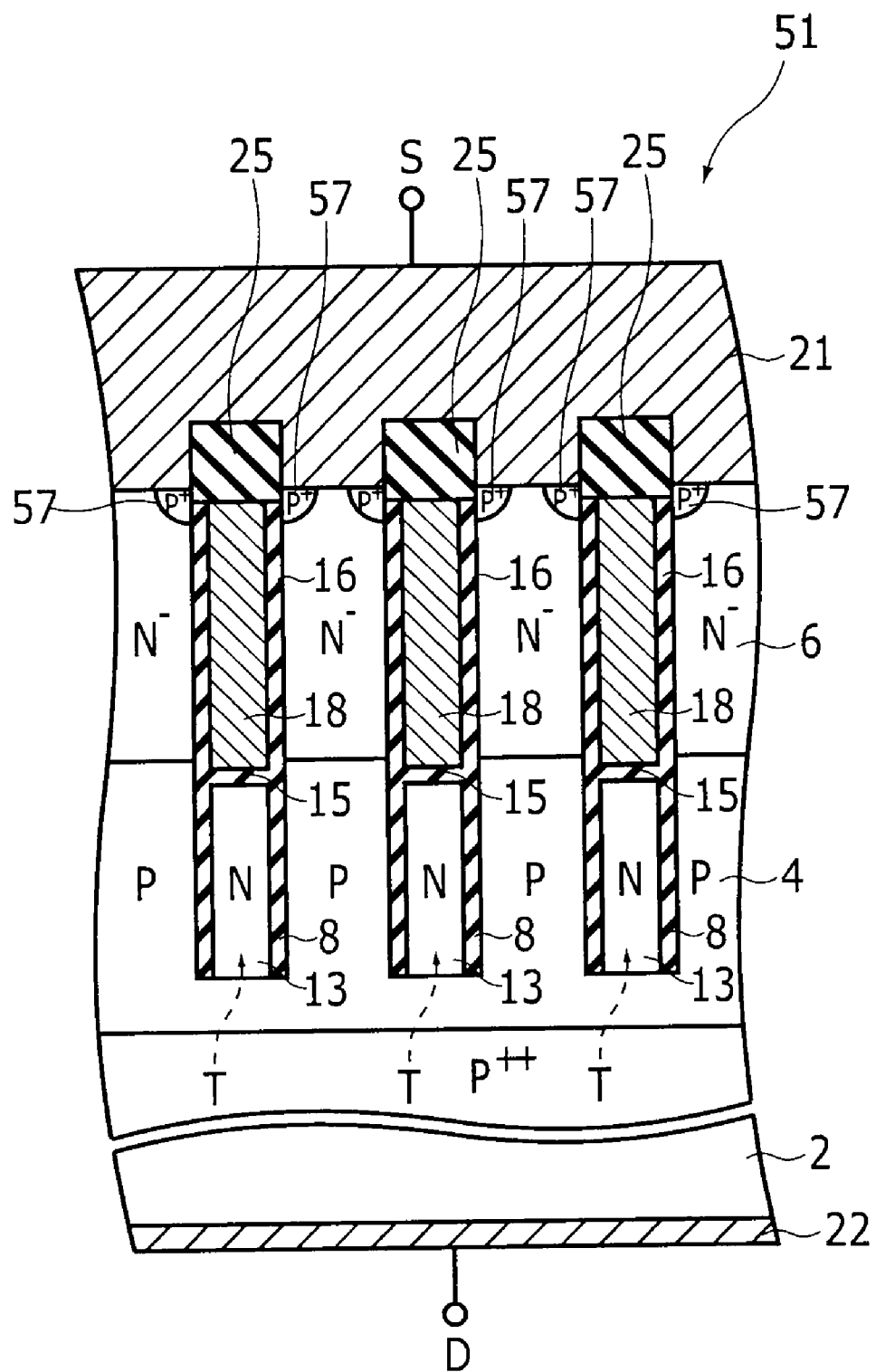
FIG. 19 is a schematic view illustrating the cross-sectional structure of the main part of a semiconductor device according to a fifth embodiment of the invention.

FIG. 19 is a schematic view illustrating the cross-sectional structure of the main part of a semiconductor device 51 according to a fifth embodiment of the invention.

In this embodiment, a second semiconductor region 57 is selectively provided around the periphery of the trench T in the surface of the first semiconductor region 6. Between the trenches T in the surface of the first semiconductor region 6, the second semiconductor regions 57 are not linked laterally with each other.

Sixth Embodiment

Figure 20:
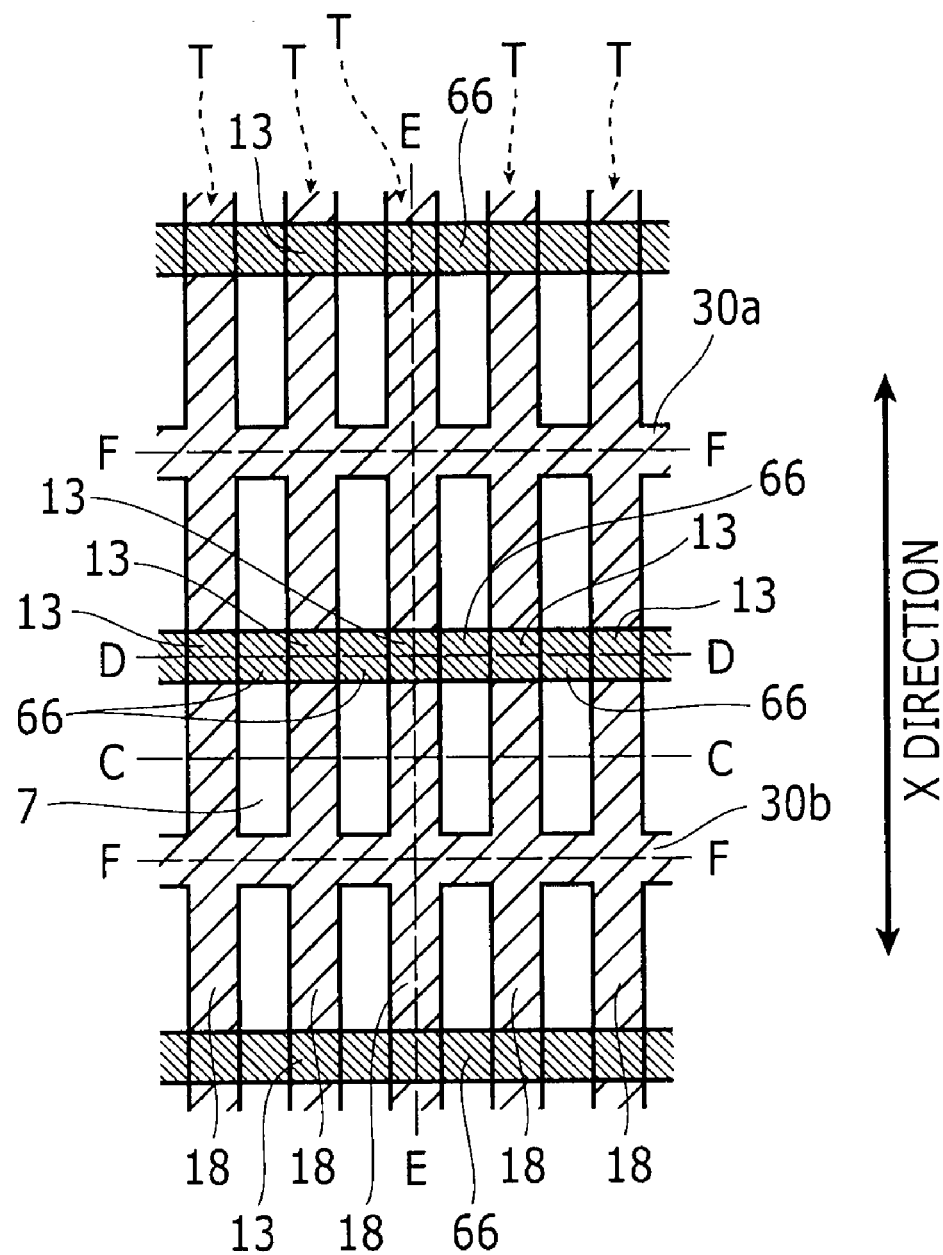
FIG. 20 is a schematic view illustrating the planar pattern of the main configuration in a semiconductor device according to a sixth embodiment of the invention.

FIG. 20 is a schematic view illustrating the planar pattern of the main configuration in a semiconductor device according to a sixth embodiment of the invention.

Figure 21:
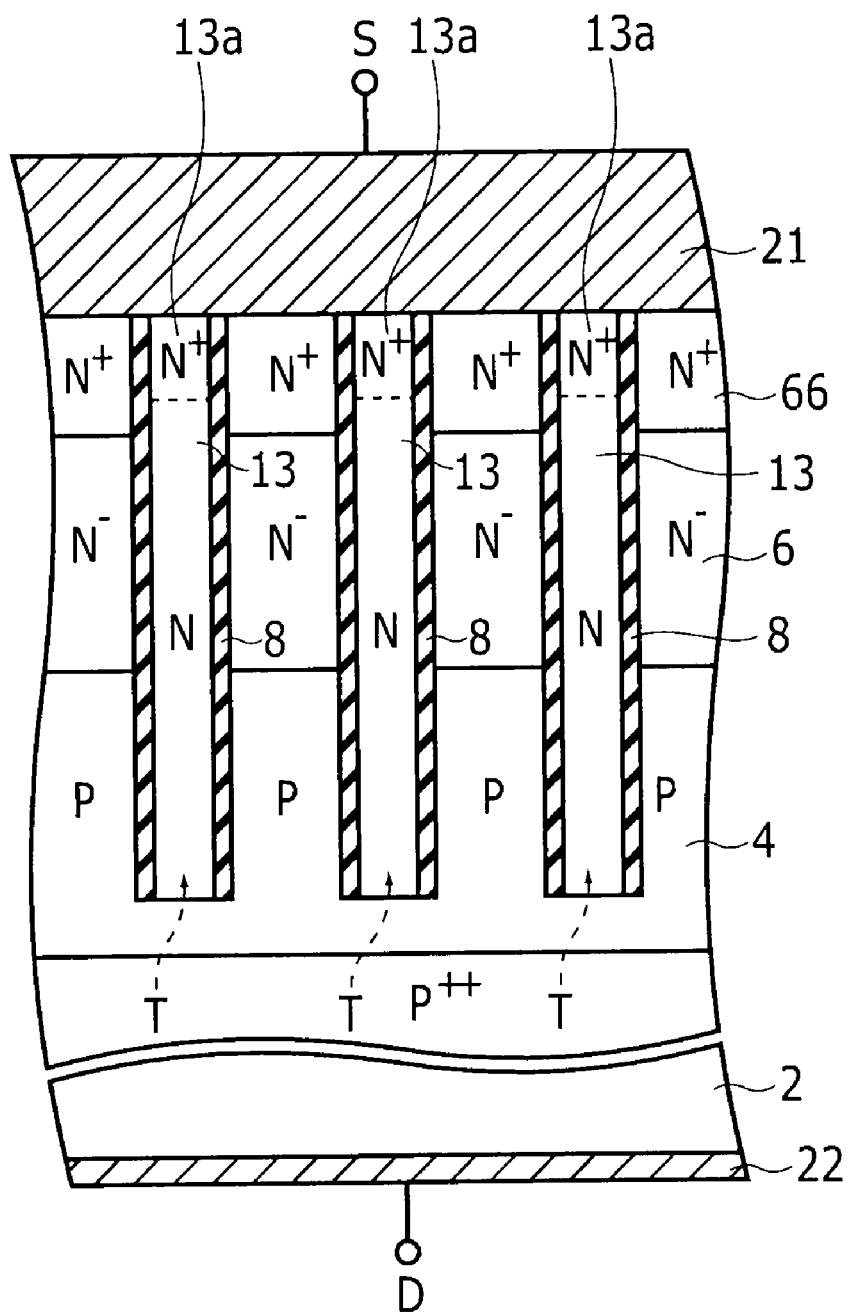
FIG. 21 is a cross-sectional view taken along line D-D in FIG. 20.

FIG. 21 is a cross-sectional view taken along line D-D in FIG. 20.

Figure 22:
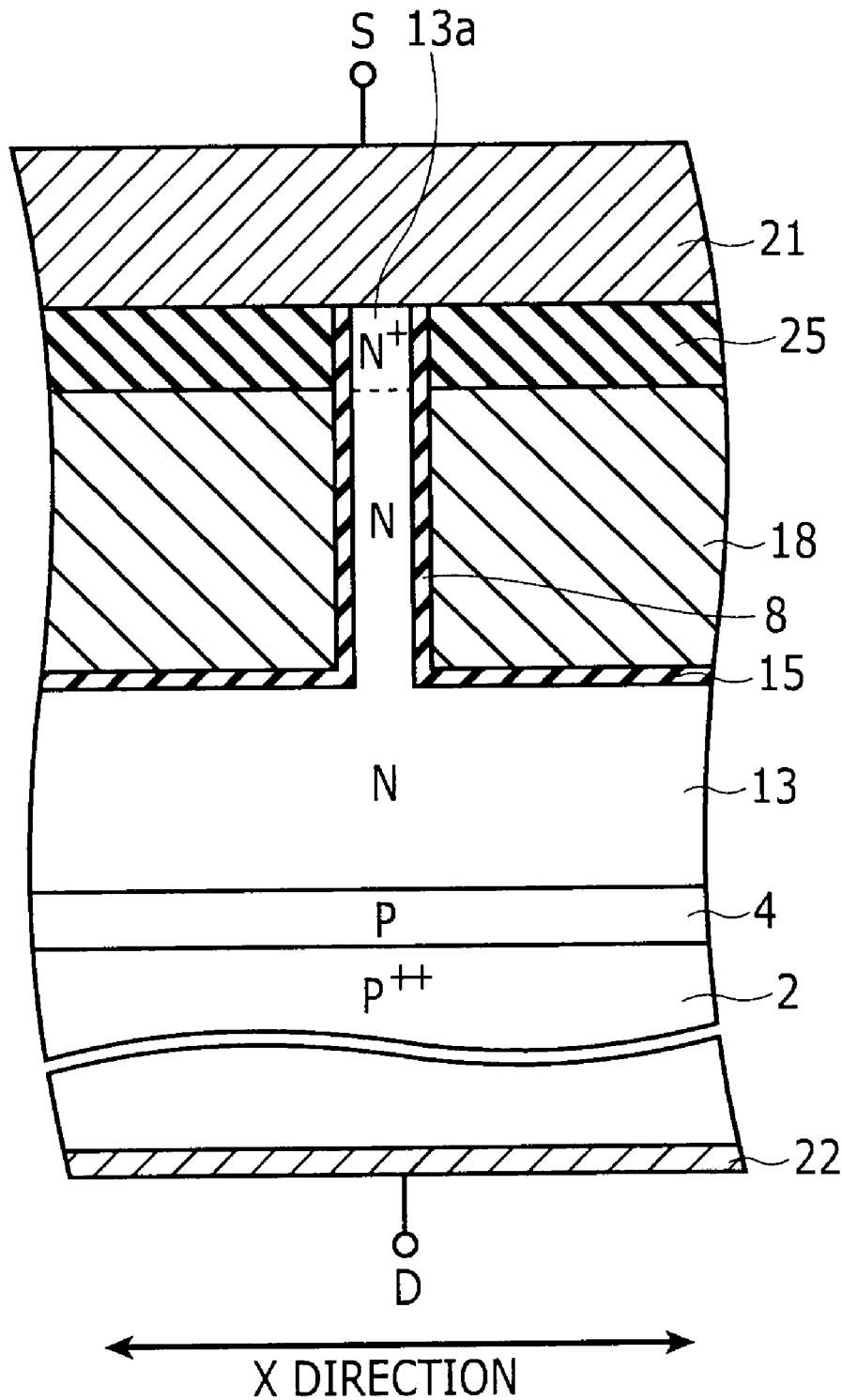
FIG. 22 is a cross-sectional view taken along line E-E in FIG. 20.

FIG. 22 is a cross-sectional view taken along line E-E in FIG. 20.

Figure 23:
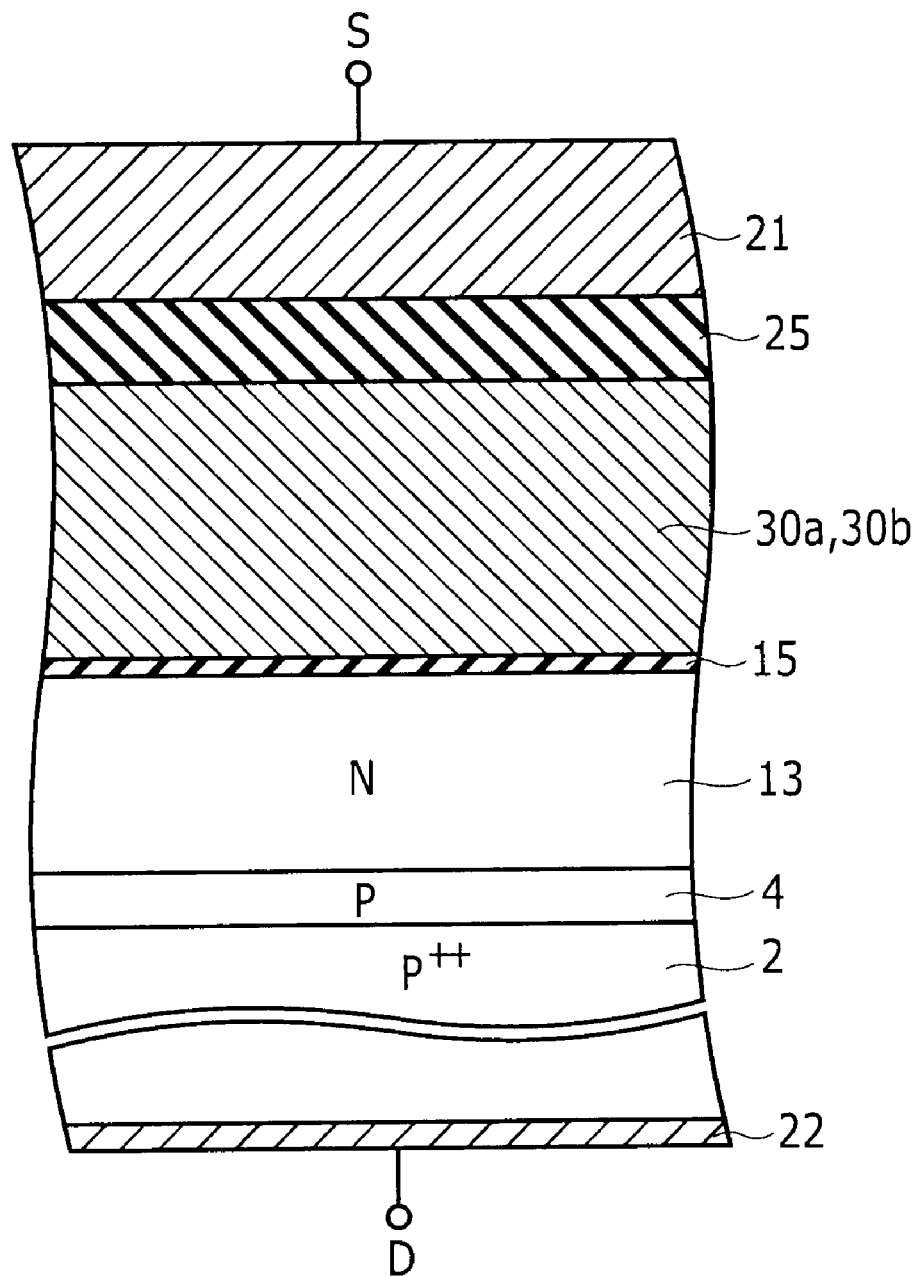
FIG. 23 is a cross-sectional view taken along line F-F in FIG. 20.

FIG. 23 is a cross-sectional view taken along line F-F in FIG. 20.

The cross section taken along line C-C in FIG. 20 has the same cross-sectional structure as that shown in FIG. 1 described above.

In this embodiment, a contact portion for connecting the third semiconductor region 13 to the source electrode (first main electrode) 21 is provided halfway along the extending direction (X direction in FIGS. 20 and 22) of the trench T. For example, after the step of FIG. 8 described above, the trench T is buried with polysilicon, and the polysilicon is etched back to a position below the interface between the drift layer 4 and the base region 6. At this time, a portion of the polysilicon is not etched back to the position below the interface between the drift layer 4 and the base region 6, but is left behind in the trench T.

More specifically, a portion of the third semiconductor region 13 fills the trench T from the bottom of the trench T up to the source region 7. The surface portion 13*a* of the third semiconductor region 13 filling the trench T has a higher dopant concentration ($N^+$-type) than the other portion of the third semiconductor region 13, and is in contact with the source electrode 21 provided on the source region 7. The third semiconductor region 13 is connected to the source electrode 21 through the surface portion 13*a* having a high dopant concentration ($N^+$-type). Thus the contact resistance between the third semiconductor region 13 and the source electrode 21 can be reduced.

The third semiconductor region 13 is connected to the source electrode 21. Furthermore, an $N^+$-type back gate region 66 is provided in a portion neighboring the surface portion 13*a* of the third semiconductor region 13 via the oxide film 8 so as to divide the source region 7. The back gate region 66 is also connected to the source electrode 21. This can facilitate releasing carriers to the source electrode 21 upon avalanche breakdown and prevent device destruction.

Note that the configuration of the back gate region 66 is not limited to dividing the source region 7. It is sufficient if a carrier releasing path from the base region 6 to the source electrode 21 can be established. Thus the back gate region 66 can be provided in any way if the base region 6 is electrically connected to the source electrode 21 through the back gate region 66.

In this embodiment, the third semiconductor region 13 is in contact with the source electrode 21 directly above the trench T in the device section where a main current path is formed. This configuration can shorten the carrier ejection path as compared with the configuration where the third semiconductor region 13 is extracted outside the device section and connected to the source electrode 21 as shown in FIG. 3 described above. Accordingly, upon avalanche breakdown, the carrier ejection efficiency can be enhanced, which is effective for preventing device destruction.

Because the portion of the third semiconductor region 13 filling the trench from the bottom to the top is provided halfway along the extending direction (X direction) of the trench T, the gate electrode 18 is divided in the X direction as shown in FIGS. 20 and 22. Thus, in this embodiment, gate interconnects 30*a*, 30*b* are provided for each group of gate electrodes 18 divided by the third semiconductor region 13. Each gate electrode 18 is divided by the third semiconductor region 13 into two portions, one of which is in cross contact with and connected to the gate interconnect 30*a*. The other portion is in cross contact with and connected to the gate interconnect 30*b*. The gate interconnect 30*a* and the gate interconnect 30*b* are connected to a gate pad (not shown), and thereby the gate electrodes 18 are electrically connected to each other.

Note that the portion of the third semiconductor region 13 filling the trench T from the bottom to the top and connected to the source electrode 21 may be repeated at a plurality of locations. In this case again, gate interconnects can be provided for each group of gate electrodes divided by the third semiconductor region 13.

Seventh Embodiment

Figure 24:
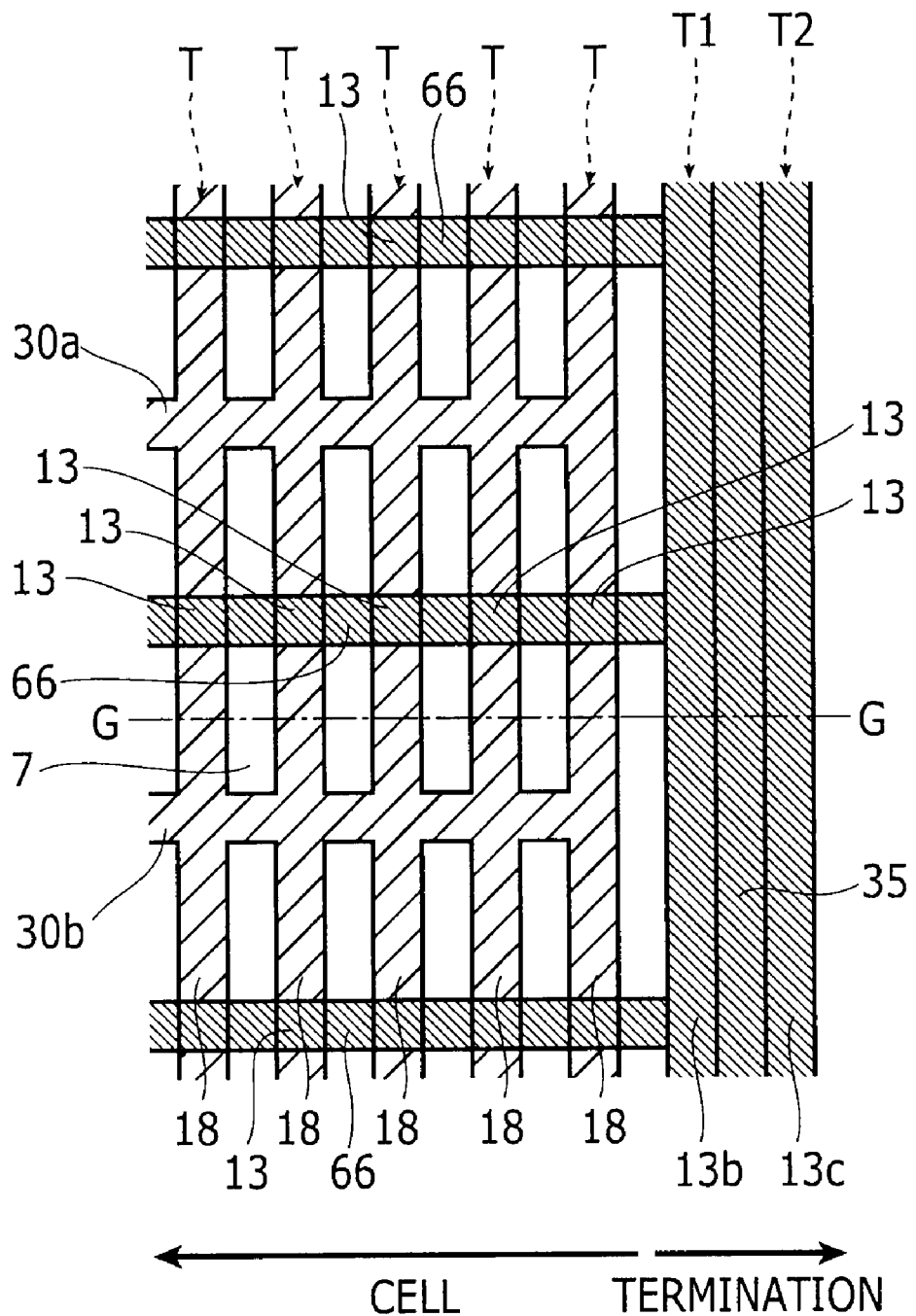
FIG. 24 is a schematic view illustrating the planar pattern of the main configuration in a semiconductor device according to a seventh embodiment of the invention.

FIG. 24 is a schematic view illustrating the planar pattern of the main configuration in a semiconductor device according to a seventh embodiment of the invention.

Figure 25:
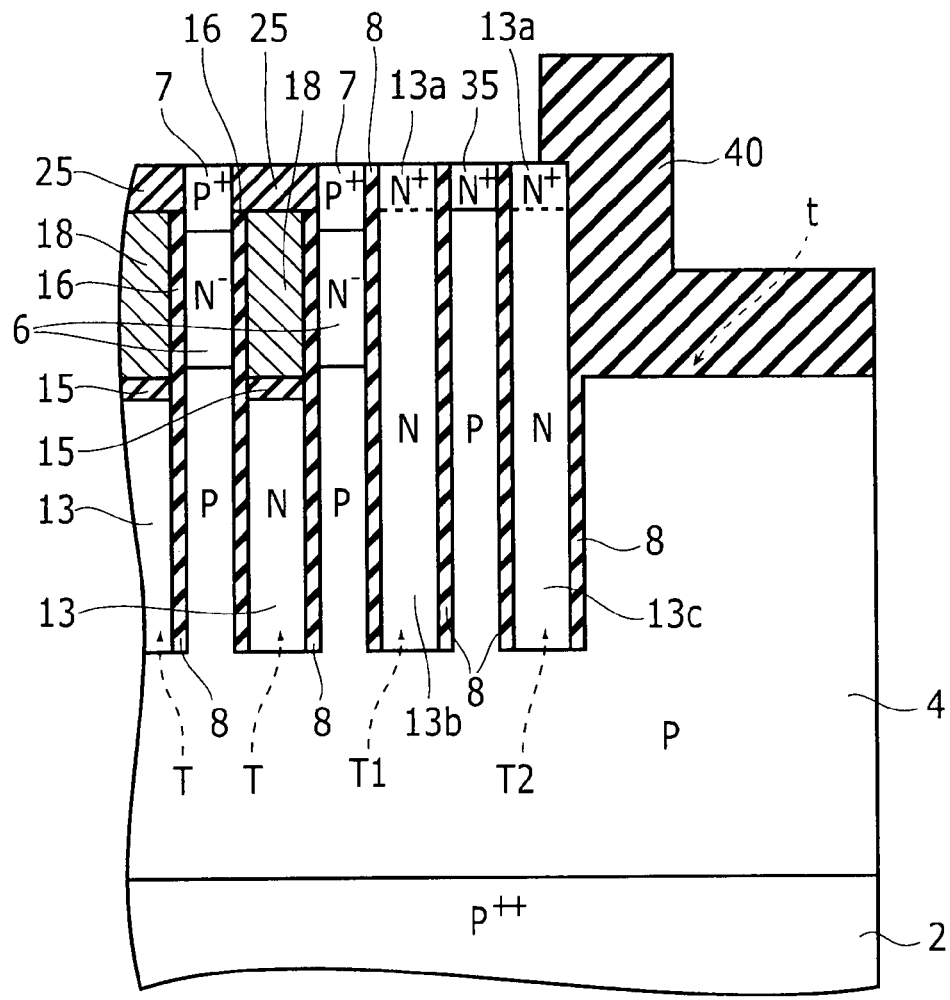
FIG. 25 is a cross-sectional view taken along line G-G in FIG. 24.

FIG. 25 is a cross-sectional view taken along line G-G in FIG. 24.

In the semiconductor device according to this embodiment, the configuration of the device section (cell) including the gate electrode 18, the base region 6, the source region 7, and the third semiconductor region 13 is the same as that in the embodiments described above. According to this configuration of the device section, as described above, a p-n junction between the drift layer 4 and the third semiconductor region 13 is formed at the bottom of the trench T. Depletion can be facilitated through this p-n junction. Therefore, even when the dopant concentration in the drift layer 4 is increased (to a dopant concentration of about $10^{17}/cm^3$, for example) for reducing ON resistance, a desired withstand voltage can be ensured. However, it is more difficult to maintain withstand voltage in the terminal section than in the device section. Therefore, when there is such a highly-doped layer in the terminal section, it is difficult to maintain withstand voltage in the terminal section.

Thus, in this embodiment, a plurality of (e.g., two in this embodiment) terminal trenches T1, T2 are formed in the drift layer 4 in the terminal section outside the device section. The terminal trenches T1, T2 are filled with semiconductor having a conductivity type opposite to that of the drift layer 4 to form terminal semiconductor regions 13b, 13c. Furthermore, an interlayer insulating film 40 buried on the major surface side of the drift layer 4 is provided adjacent to the outermost semiconductor region 13c of the terminal semiconductor regions 13b, 13c.

The terminal trenches T1, T2 and the insulating film 8 formed on the inner surface of the sidewall thereof are formed in the same process and at the same time as the trench T and the insulating film 8 in the device section, and results in the state shown in FIG. 8. Then the trenches T, T1, T2 are buried with N-type polysilicon, for example. In the trench T of the device section, the buried polysilicon is etched back to a position below the interface between the drift layer 4 and the base region 6. However, the polysilicon in the terminal trenches T1, T2 is not etched back to the position below the interface between the drift layer 4 and the base region 6, but is left behind in the trenches T1, T2.

The surface portion 13a of the terminal semiconductor region 13b, 13c has a higher dopant concentration ($N^+$-type) than the other portion of the terminal semiconductor region 13b, 13c, and is in contact with the source electrode provided on the source region 7. The surface portion of the drift layer 4 interposed between the terminal trenches T1 and T2 is also provided with a contact region 35 having a high dopant concentration ($N^+$-type), which is also in contact with the source electrode.

Like the device section, no insulating film is formed at the bottom of the terminal trench T1, T2. The drift layer 4 forms a p-n junction with the terminal semiconductor region 13b, 13c. Between the terminal trenches T1 and T2 (terminal semiconductor regions 13b and 13c), no base region 6 is formed, but a drift layer 4 is interposed. That is, the N-type terminal semiconductor regions 13b, 13c and the P-type drift layer 4 are alternately juxtaposed via insulating films 8. Therefore, when a voltage is applied between the drain and the source, a depletion layer can be extended in the juxtaposed portion of the terminal semiconductor regions 13b, 13c and the drift layer 4. Thus a sufficient withstand voltage can be ensured in the terminal.

FIG. 26 is a schematic view illustrating a method for forming an interlayer insulating film 40 buried on the major surface side of the drift layer 4 and adjacent to the outermost semiconductor region 13c.

Figure 26A:
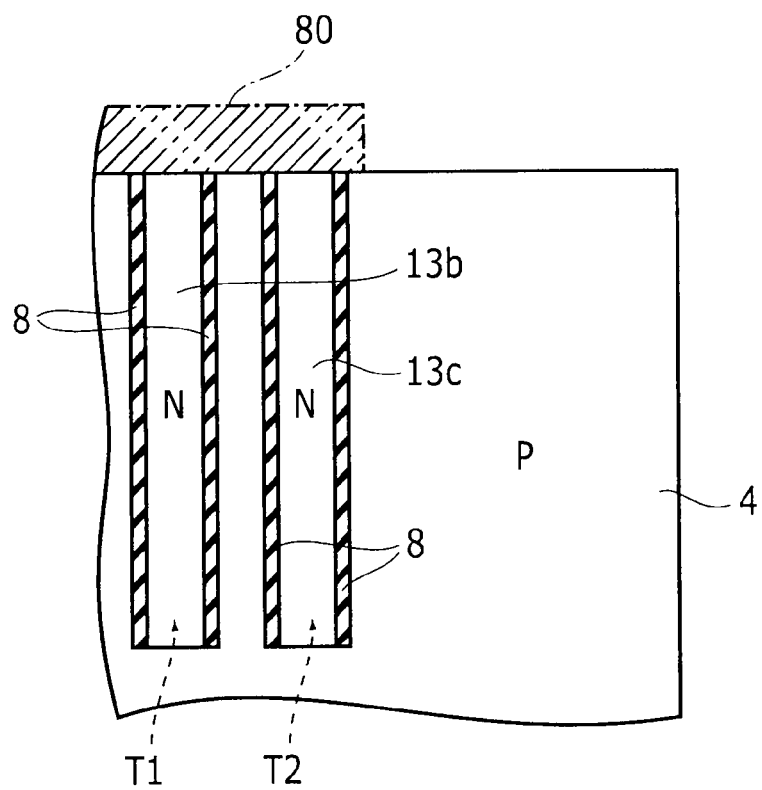
FIG. 26 is a process cross-sectional view illustrating the main part of a process of manufacturing a semiconductor device according to the seventh embodiment.
Figure 26B:
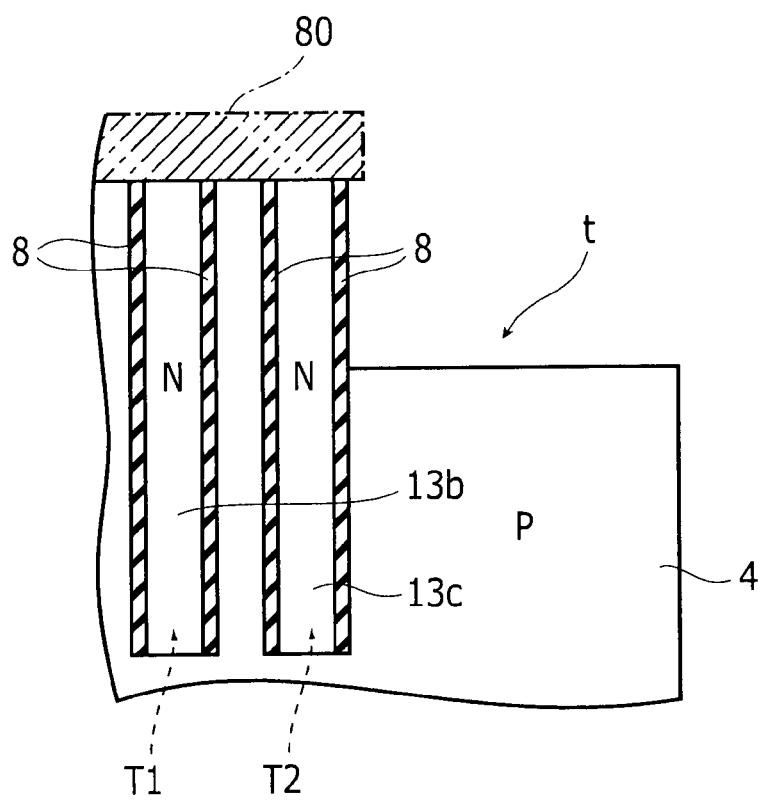

After the terminal trenches T1, T2 and the terminal semiconductor regions 13b, 13c filling them are formed, an etching mask 80 is formed on the terminal trenches T1, T2 (terminal semiconductor regions 13b, 13c) as shown in FIG. 26A. The etching mask 80 is used as a mask to etch the drift layer 4 outside the outermost semiconductor region 13c by CDE (Chemical Dry Etching). As a result of this etching, a trench t is formed on the frontside of the drift layer 4 as shown in FIG. 26B. Then the trench t is buried with an interlayer insulating film (e.g., silicon oxide film) 40. The distance between the drain potential portion and the source potential portion can be increased by the amount corresponding to the depth of the interlayer insulating film 40. Thus the electric field concentration on the terminal surface portion is alleviated, and the withstand voltage is enhanced.

In this embodiment, the trench t to be buried with the interlayer insulating film 40 is formed by CDE. Therefore the drift layer 4 can be etched isotropically. Thus, even if the edge of the etching mask 80 is not accurately aligned with the boundary between the drift layer 4 and the insulating film 8 provided on the side face on the terminal side of the outermost semiconductor region 13c, the drift layer 4 outside the insulating film 8 can be completely removed.

The number of terminal trenches T1, T2 and terminal semiconductor regions 13b, 13c filling them is not limited to two, but may be three or more.

Eighth Embodiment

Figure 27:
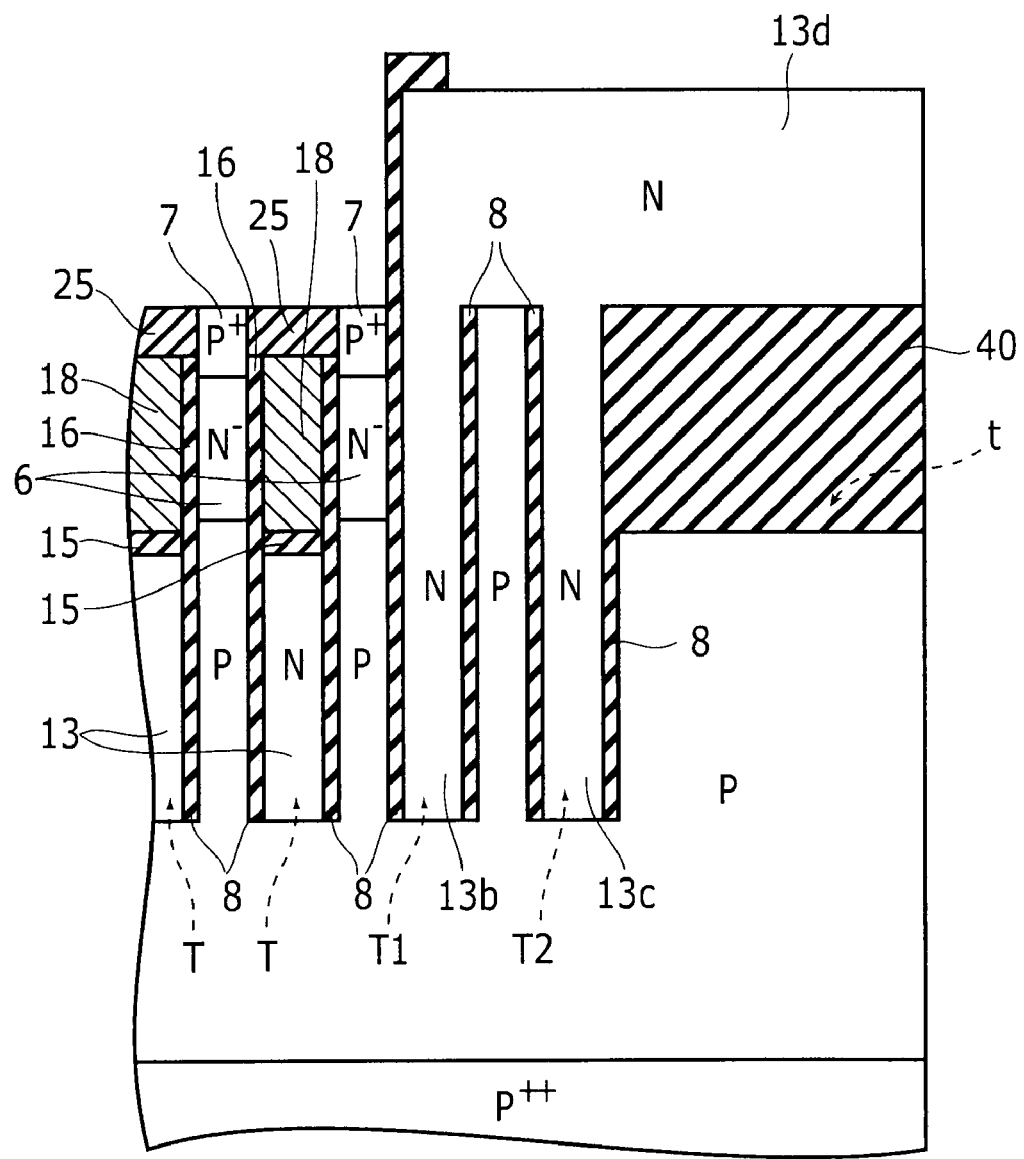
FIG. 27 is a schematic view illustrating the cross-sectional structure of the main part of a semiconductor device according to an eighth embodiment of the invention.

FIG. 27 is a schematic view illustrating the cross-sectional structure of the main part of a semiconductor device according to an eighth embodiment of the invention.

In this embodiment, a trench t and an interlayer insulating film 40 buried therein are formed in advance beside the outermost terminal trench T2. Then the terminal trenches T1, T2 are buried with N-type polysilicon, for example, to form N-type terminal semiconductor regions 13b, 13c with a P-type drift layer 4 being interposed therebetween. The polysilicon in the terminal trenches T1, T2 is extracted above the surface of the terminal section and connected to a source electrode (not shown).

In this embodiment again, when a voltage is applied between the drain and the source, a depletion layer can be extended in the juxtaposed portion of the terminal semiconductor regions 13b, 13c and the drift layer 4. Furthermore, the distance between the drain potential portion and the source potential portion can be increased by the amount corresponding to the depth of the interlayer insulating film 40. Thus the electric field concentration on the terminal surface portion is alleviated, and the withstand voltage is enhanced.

Ninth Embodiment

Figure 28:
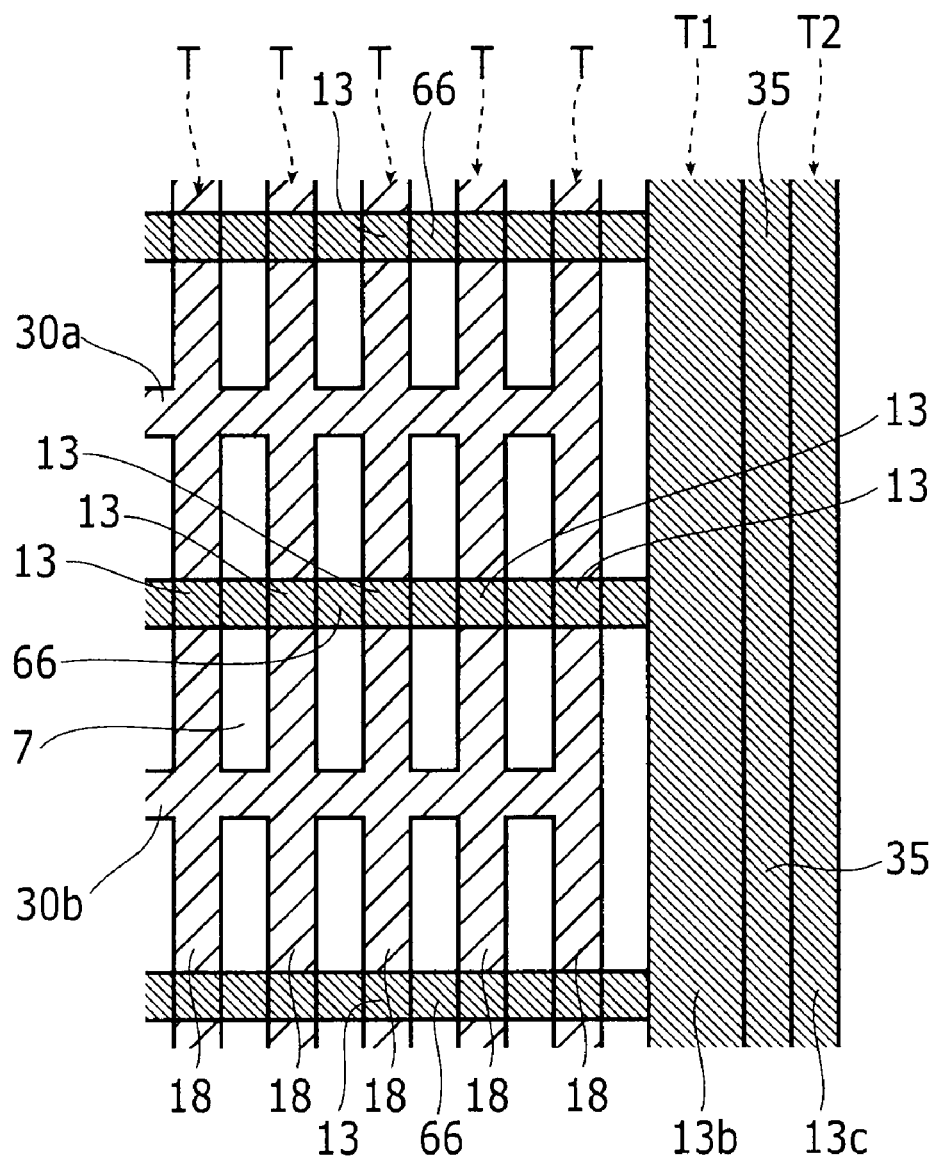
FIG. 28 is a schematic view illustrating the planar pattern of the main configuration in a semiconductor device according to a ninth embodiment of the invention.

FIG. 28 is a schematic view illustrating the planar pattern of the main configuration in a semiconductor device according to a ninth embodiment of the invention.

In the seventh and eighth embodiment described above, the inventors found that the electric field tends to concentrate on the terminal section, particularly in the vicinity of the outermost semiconductor region 13c. From the viewpoint of alleviating the electric field concentration in the vicinity of the outermost semiconductor region 13c, the dopant concentration in the terminal semiconductor region 13b on the device section side is preferably made higher than the dopant concentration in the outermost semiconductor region 13c. When the dopant concentration in the terminal semiconductor region 13b on the device section side is made higher than the dopant concentration in the outermost semiconductor region 13c, the electric field concentration point can be shifted from the outermost semiconductor region 13c to the terminal semiconductor region 13b on the device section side. Thus the electric field concentration in the vicinity of the outermost semiconductor region 13c can be alleviated.

However, the amount of dopant in the semiconductor regions 13b, 13c is not highly controllable. Hence, in this embodiment shown in FIG. 28, the pattern width is made larger in the terminal semiconductor region 13b on the device section side than in the outermost semiconductor region 13c. Thus the dopant concentration in the terminal semiconductor region 13b on the device section side is made higher than the dopant concentration in the outermost semiconductor region 13c.

Tenth Embodiment

Figure 29:
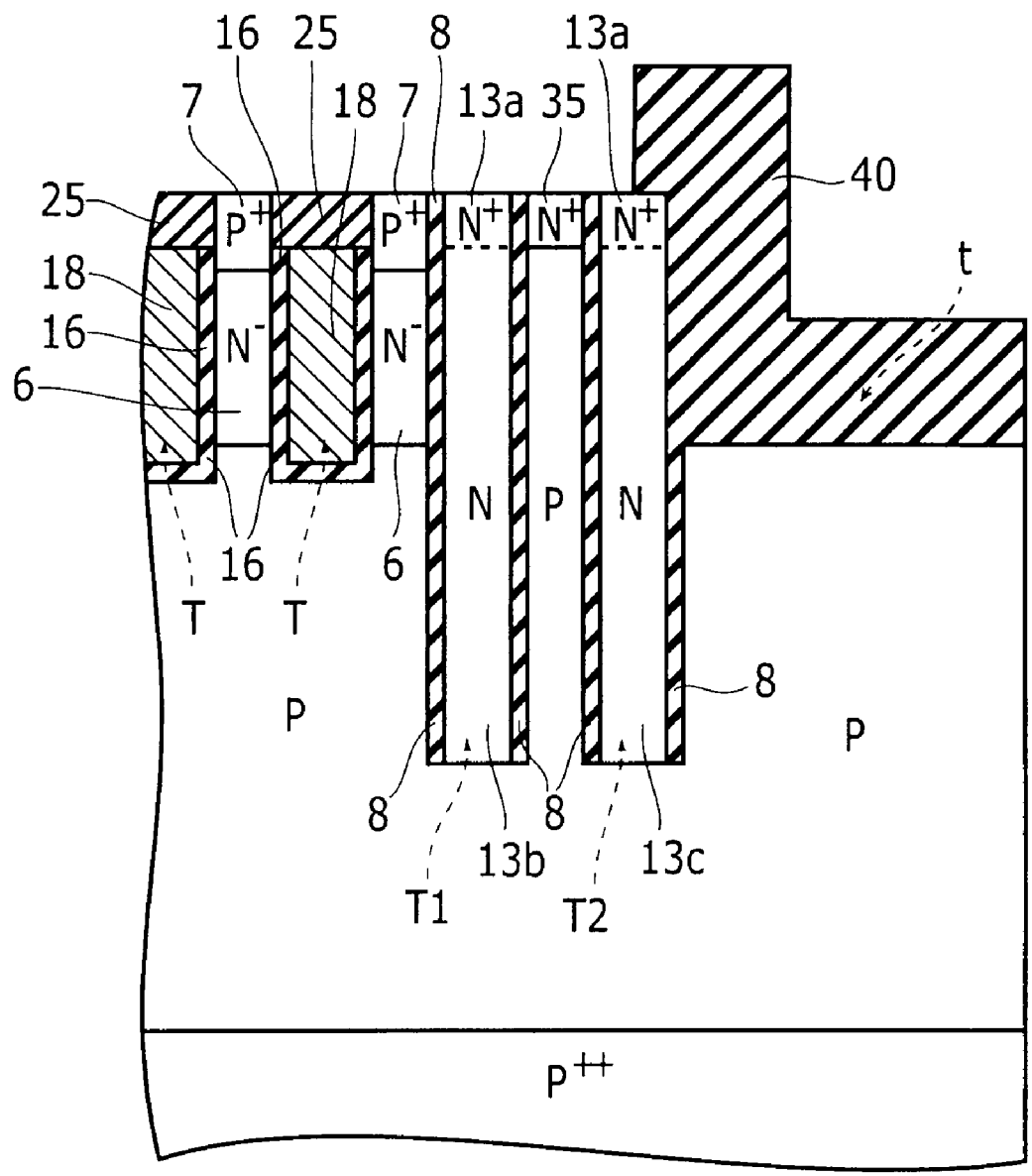
FIG. 29 is a schematic view illustrating the cross-sectional structure of the main part of a semiconductor device according to a tenth embodiment of the invention.

FIG. 29 is a schematic view illustrating the cross-sectional structure of the main part of a semiconductor device according to a tenth embodiment of the invention.

Comparing with the seventh to ninth embodiment described above, this embodiment is the same in the configuration of the terminal section, but different in the configuration of the device section. More specifically, the trench T in the device section is formed shallower than the terminal trenches T1, T2, and the third semiconductor region 13 forming a p-n junction with the drift layer 4 is not provided below the gate electrode 18.

In this embodiment again, when a voltage is applied between the drain and the source, a depletion layer can be extended in the juxtaposed portion of the terminal semiconductor regions 13b, 13c and the drift layer 4. Furthermore, the distance between the drain potential portion and the source potential portion can be increased by the amount corresponding to the depth of the interlayer insulating film 40. Thus the electric field concentration on the terminal surface portion is alleviated, and the withstand voltage is enhanced.

In FIG. 29, the semiconductor device having a structure of trench-gate type is exemplarily shown, however, the invention is not limited to this specific structure but includes semiconductor devices having a structure of planar-gate type. Further, the MOS gate transistor structure can be replaced to p-n diode structure or Schottky diode structure. That is, the MOS gate structure of this embodiment may be replaced to various kinds of device structures, and these variants are also included in the invention.

Embodiments of the invention have been described with reference to the examples. However, the invention is not limited thereto, but various modifications can be made within the spirit of the invention.

The semiconductor region may be formed in a floating structure, instead of being connected to the first main electrode (source electrode). However, complete depletion of the semiconductor region and the semiconductor layer (drift layer) is facilitated more effectively when the semiconductor region is connected to the first main electrode.

The semiconductor region and the gate electrode are not limited to being extracted in the same direction as shown in FIG. 3, but may be extracted in opposite directions.

Besides silicon oxide film, the insulating film and the interlayer insulating film may be made of silicon nitride film or the like. Each semiconductor element may be made of semiconductors other than silicon (e.g., Ge, SiGe, SiC, GaAs, GaN, etc.).

The invention claimed is:

1. A semiconductor device comprising:
   a semiconductor layer of a first conductivity type;
   a first semiconductor region of a second conductivity type provided on a major surface of the semiconductor layer;
   a second semiconductor region of the first conductivity type provided in a surface portion of the first semiconductor region;
   a trench extending through the second semiconductor region and the first semiconductor region to the semiconductor layer;
   a first insulating film provided on an inner wall of the trench;
   a third semiconductor region of the second conductivity type filling the trench below an interface between the semiconductor layer and the first semiconductor region;
   a second insulating film provided on the third semiconductor region;
   a gate electrode filling the trench above the second insulating film;
   a first main electrode formed directly on a top surface of the second semiconductor region; and
   a second main electrode provided on a side opposite to the major surface of the semiconductor layer;
   wherein a portion of the first insulating film in direct contact with the semiconductor layer is opened, and the semiconductor layer is in direct contact with the third semiconductor region through the opened portion;
   wherein the third semiconductor region is connected to the first main electrode; and
   wherein a portion of the third semiconductor region fills the trench from the bottom of the trench up to the second semiconductor region, and the third semiconductor region has a surface portion in direct contact with the first main electrode.

2. The semiconductor device according to claim 1, wherein the surface portion of the third semiconductor region has a higher dopant concentration than the other portion of the third semiconductor region.

* * * * *